United States Patent
Rokuhara

(10) Patent No.: US 9,648,794 B2
(45) Date of Patent: May 9, 2017

(54) WIRING BOARD AND ELECTRONIC APPARATUS

(71) Applicant: Sony Corporation, Tokyo (JP)

(72) Inventor: Shinji Rokuhara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 636 days.

(21) Appl. No.: 13/855,073

(22) Filed: Apr. 2, 2013

(65) Prior Publication Data
US 2013/0265736 A1    Oct. 10, 2013

(30) Foreign Application Priority Data

Apr. 5, 2012 (JP) .................................. 2012-086072
Jul. 12, 2012 (JP) .................................. 2012-156614

(51) Int. Cl.
*H05K 9/00* (2006.01)
*H05K 1/02* (2006.01)
*H05K 3/46* (2006.01)

(52) U.S. Cl.
CPC .......... *H05K 9/0064* (2013.01); *H05K 1/0236* (2013.01); *H05K 3/4605* (2013.01)

(58) Field of Classification Search
CPC ... H05K 9/0064; H05K 1/0236; H05K 3/4605
USPC ....................................................... 361/760
See application file for complete search history.

(56) References Cited

U.S. PATENT DOCUMENTS

| | | | | |
|---|---|---|---|---|
| 5,261,153 A | * | 11/1993 | Lucas | H05K 1/162 216/102 |
| 2005/0029632 A1 | * | 2/2005 | McKinzie et al. | 257/665 |
| 2006/0050010 A1 | * | 3/2006 | Choi | H01Q 15/006 343/909 |
| 2011/0273348 A1 | * | 11/2011 | Lopez | H01Q 1/243 343/749 |

FOREIGN PATENT DOCUMENTS

| | | |
|---|---|---|
| JP | 2008-177363 | 7/2008 |
| JP | 2010-519777 | 6/2010 |
| JP | 4755966 | 8/2011 |
| WO | 2009131140 A1 | 10/2009 |

OTHER PUBLICATIONS

Toyota, Y., et al., "Miniaturization of Planar EBG Structure Formed in Power Source/Ground Plane in Printed Circuit Board to Suppress Propagation of unnecessary Electromagnetic Wave", EMC, vol. J90-B, No. 11 pp. 1135-1142.

* cited by examiner

*Primary Examiner* — Jenny L Wagner
*Assistant Examiner* — Michael E Moats, Jr.
(74) *Attorney, Agent, or Firm* — Chip Law Group

(57) ABSTRACT

The present disclosure provides a wiring board including a thin film member configured to include an inorganic dielectric film formed over an overall area of a mounting face thereof for an electronic part, a first conductive film formed over an overall area of one of faces of the inorganic dielectric film and including a plurality of patch electrode portions disposed in a predetermined pattern corresponding to a predetermined electromagnetic band gap structure in at least part of the area, and a second conductive film formed over an overall area of the other face of the inorganic dielectric film.

14 Claims, 20 Drawing Sheets

WIRING BOARD AND ELECTRONIC APPARATUS

BACKGROUND

The present disclosure relates to a wiring board on which electronic parts are mounted and an electronic apparatus which includes the wiring board.

Generally, it is known that, in a printed wiring board, a resonance mode between a ground electrode and a power supply electrode caused by simultaneous switching noise (SSN) has a bad influence on signal integrity and a characteristic of electromagnetic interference (EMI). Thus, various proposals have been made for a technique for reducing the influence of the noise. For example, a technique of disposing a decoupling capacitor on a printed wiring board, another technique of separating planes (electrodes) and so forth have been proposed. Recently, a further technique has been proposed wherein an electromagnetic band gap (EBG) structure which generates an attenuation characteristic (band gap) in a specific frequency band is provided on a printed wiring board. The technique just described is disclosed, for example, in U.S. Published Application No. 2005/0029632 A1 (hereinafter referred to as Patent Document 1) and U.S. Published Application No. 2006/0050010 A1 (hereinafter referred to as Patent Document 2).

In Patent Document 1, an EBG structure of a type called mushroom type is proposed. The mushroom type EBG structure includes a conductor plane of a power supply level, another conductor plane of a ground level, and a conductor layer formed from a plurality of small conductor pieces of a polygonal surface shape, the conductor layer being provided between the two conductor planes and disposed periodically in arrays in the board surface. Further, in the EBG structure of the mushroom type, the small conductor pieces are electrically connected to one of the conductor plane of the power supply level and the conductor plane of the ground level. Furthermore, in the EBG structure of Patent Document 1, a dielectric layer is provided between the conductor plane of the power supply level and the conductor layer and between the conductor plane of the ground level and the conductor layer.

The EBG structure of the mushroom type proposed in Patent Document 1 has a three-layer structure wherein three conductive films are stacked with the dielectric layers interposed therebetween. Therefore, in the technology of Patent Document 1, in order to provide the EBG structure on a printed wiring board, it is necessary to additionally provide one layer of a conductive film between the conductor plane of the power supply level and the conductor plane of the ground level. In this instance, there is a subject that the structure of the printed wiring board is complicated and a higher cost is required for the printed wiring board.

In order to solve the subject of the EBG structure of the mushroom type described above, Patent Document 2 proposes an EBG structure configured such that there is no necessity to provide one layer of a conductive film between the conductor plane of the power supply level and the conductor plane of the ground level. The EBG structure proposed in Patent Document 2 is called AI (Alternating Impedance)-EBG structure.

In the AI-EBG structure, one of the conductive film connected to the power supply and the grounded conductor film is configured from a plurality of small conductor pieces (hereinafter referred to as patch electrode portions) of a square surface shape of a large size, and a plurality of small conductor pieces (hereinafter referred to as branch electrode portions) of a square surface shape of a small size. In the AI-EBG structure, the patch electrode portions are periodically arrayed on the board surface, and each of the branch electrode portions is disposed so as to electrically connect two adjacent ones of the patch electrode portions. Such an AI-EBG structure as just described is a two-layer structure wherein two conductive films are stacked with a dielectric layer interposed therebetween.

It is to be noted that both of the EBG structure of the mushroom type and the AI-EBG structure described above act as a filter for suppressing noise in a desired frequency band. Therefore, in the EBG structures, the size and the shape of the conductor elements, namely, the small conductor pieces and the patch electrode portions, are adjusted to suitably set the capacitance component and the inductance component of the EBG structure thereby to cause a band gap, namely, an attenuation band, to appear in a predetermined frequency band.

If it is tried to apply the EBG structure described above to consumer applications such as, for example, a portable telephone set, then there are two subjects including increase of the frequency band in which noise is suppressed and miniaturization of the EBG structure. Particularly with regard to the former subject, it is desirable to configure the EBG structure so that the noise suppression effect can be obtained from a comparatively low frequency band.

As a technique for expanding the frequency band in which noise is suppressed, namely, the frequency band of the band gap, in the EBG structure, various technique have been proposed, for example, in JP-T-2010-519777 (hereinafter referred to as Patent Document 3) or Japanese Patent Laid-Open No. 2008-177363 (hereinafter referred to as Patent Document 4). In Patent Document 3, a technique of combining AI-EBG structures having frequency bands of the band gap different from each other is proposed. However, according to the technique of Patent Document 3, since a plurality of AI-EBG structures are provided, miniaturization of the EBG structure and hence of the printed wiring board is difficult. It is to be noted that Patent Document 3 proposes nothing of miniaturization of the EBG structure.

Meanwhile, Patent Document 4 suggests that, by reducing the thickness of a dielectric layer or insulating layer to 25 μm or less, the band gap disappears and the attenuation band can be expanded. However, also data contrary to the suggestion of Patent Document 4 has been disclosed, for example, in Hirotaka TOYODA and four others, "Miniaturization of a planar EBG structure for unnecessary electromagnetic wave propagation suppression formed in power supply/ground planes of printed circuit board," Journal of the Institute of Electronics, Information and Communication Engineers B, Vol. 10 J90-B, No. 11, pp. 1135-1142 (hereinafter referred to as Non-Patent Document 1). In Non-Patent Document 1, data is disclosed that, in the case where the relative dielectric constant ∈r of the dielectric film provided between the conductor plane of the power supply level and the conductor plane of the ground level is 30 and the film thickness of the dielectric film is 16 μm, a band gap appears from 1.8 GHz.

Also for a technique for miniaturization of the EBG structure or filter, various proposals have been made and are disclosed, for example, in Non-Patent Document 1 or Japanese Patent No. 4755966 (hereinafter referred to as Patent Document 5). In Non-Patent Document 1, a technique of increasing the relative dielectric constant ∈r of a dielectric film to increase the capacitor component of the EBG structure thereby to achieve miniaturization of the EBG structure is proposed. Meanwhile, in Non-Patent Document 1 and Patent Document 5, a technique of providing a magnetic layer on one surface of a dielectric layer to increase the inductance component of the EBG structure thereby to achieve miniaturization of the EBG structure is disposed. However, even if the techniques are used, the size of the EBG structure or filter is a several cm order size, and it is difficult to achieve a several mm order size necessary for consumer applications.

Meanwhile, with regard to miniaturization of the EBG structure, it is suggested that the EBG structure of the mushroom type has a limitation to reduction in thickness of the dielectric layer due to irregularities of the small conductor pieces which configure the EBG structure (refer to, for example, PCT Patent Publication No. WO2009/131140 A1 (hereinafter referred to as Patent Document 6)). Patent Document 6 further suggests that, in order to miniaturize the EBG structure, it is effective to make the distance between a plurality of small conductor pieces and a conductor plate opposing to the small conductor pieces small and to form the dielectric layer from a material having a high relative dielectric constant. However, also it is pointed out in Patent Document 6 that particular measures for implementing the EBG structure of such a configuration as just described have not been found as yet and desired miniaturization of the EBG structure cannot be achieved.

Further, it is proposed in Patent Document 6 that, since it is difficult to form an EBG structure or filter of the several mm order on a printed wiring board, an EBG structure is formed on a rigid board such as a silicon interposer board to fabricate a filter of the several mm order. However, this technique increases the fabrication cost in comparison with an ordinary fabrication process of a printed wiring board. Further, this technique requires, midway of the fabrication process, a step of embedding a rigid board as a part into the printed wiring board, which further increases the fabrication cost. It is to be noted that, in the EBG structure proposed in Patent Document 6, a band gap appears in a predetermined frequency band and the subject of increase of the attenuation band described hereinabove, namely, achievement of a wider bandwidth, is not eliminated.

SUMMARY

As described hereinabove, although various printed wiring boards which include an EBG structure have been proposed, the size of the EBG structures is the several cm order and the EBG structures are not suitable for consumer applications such as a portable telephone set. Further, in recent years, the operating frequency of electronic parts becomes so high as several GHz or the like. Therefore, the problem of EMI does not remain in the field of mother boards but expands to the field of packages of the interposer boards and so forth on which an IC (Integrated Circuit) chip is mounted. In order to mount an EBG structure on such an interposer board or a SoP (System on Package), an EBG structure or filter of a several mm order size is required. However, to implement such a size as just described with the available EBG structures is difficult as described above.

Further, as described hereinabove, in consumer applications such as a portable telephone set, not only miniaturization of the EBG structure but also expansion of the attenuation band are required. However, as described hereinabove, an EBG structure which can achieve both of miniaturization of the EBG structure and expansion of the attenuation band has not been proposed as yet.

Therefore, it is desirable to provide a wiring board having an EBG structure with which the size is further reduced and an attenuation characteristic is obtained over a greater frequency band such as, for example, from several MHz to several tens GHz, and an electronic apparatus which includes such a wiring board.

According to an embodiment of the present disclosure, there is provided a wiring board including a thin film member configured to include an inorganic dielectric film formed over an overall area of a mounting face thereof for an electronic part, a first conductive film formed over an overall area of one of faces of the inorganic dielectric film and including a plurality of patch electrode portions disposed in a predetermined pattern corresponding to a predetermined electromagnetic band gap structure in at least part of the area, and a second conductive film formed over an overall area of the other face of the inorganic dielectric film.

According to another embodiment of the present disclosure, there is provided an electronic apparatus including a wiring board including a thin film member which includes an inorganic dielectric film formed over an overall area of a mounting face thereof for an electronic part, a first conductive film formed over an overall area of one of faces of the inorganic dielectric film and including a plurality of patch electrode portions disposed in a predetermined pattern corresponding to a predetermined electromagnetic band gap structure in at least part of the area, and a second conductive film formed over an overall area of the other face of the inorganic dielectric film; and an electronic part mounted on the wiring board.

In the wiring board and the electronic apparatus of the present disclosure, a dielectric film which configures an EBG structure is configured from an inorganic dielectric film. Further, a thin film member including the EBG structure is provided over an overall area of the mounting face of a wiring board for an electronic part. Due to the configuration, according to the present disclosure, both of miniaturization of the EBG structure and expansion of the attenuation band can be anticipated.

DETAILED DESCRIPTION OF THE PREFERRED EMBODIMENT

In the following, an example of a wiring board and an electronic apparatus including the wiring board according to an embodiment of the present disclosure is described in the following order with reference to the accompanying drawings. However, the present disclosure is not limited to the examples described below.
1. Example of the Configuration of the Multilayer Wiring Board
2. Example of the Performance Validation of the Multilayer Wiring Board
3. Modification
4. Example of the Configuration of the Electronic Apparatus (Application Example)

<1. Example of the Configuration of the Multilayer Wiring Board>

Figure 1A:
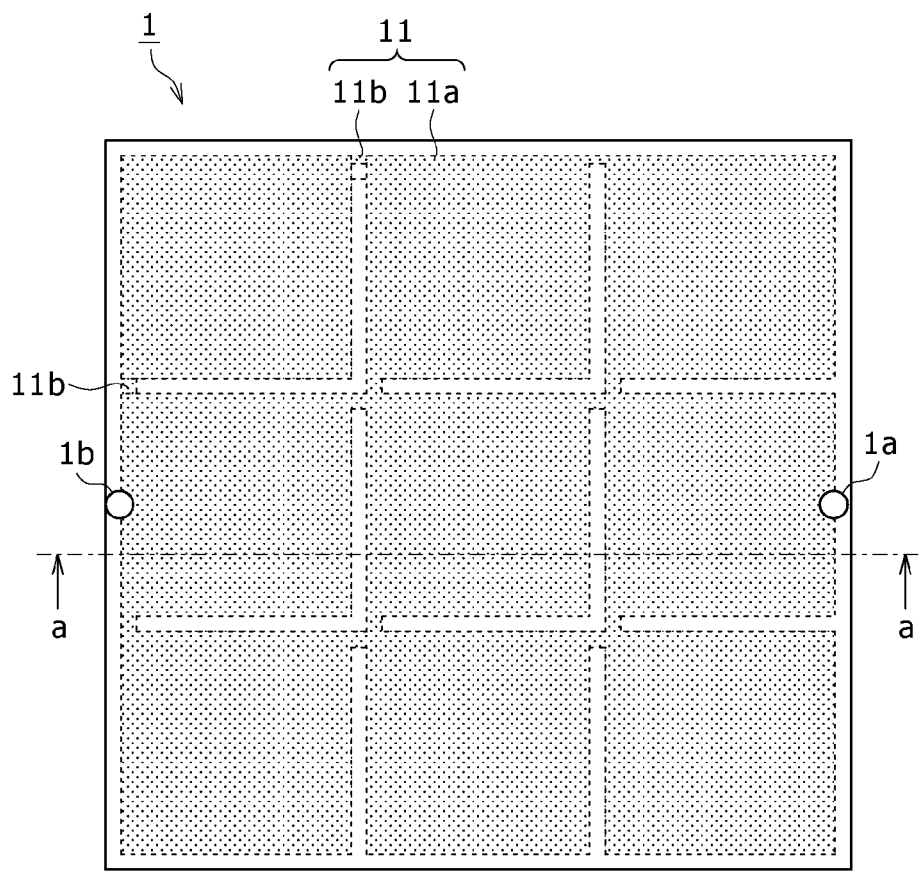
FIGS. 1A and 1B are schematic views showing a configuration of a multilayer wiring board according to an embodiment of the present disclosure.
Figure 1B:
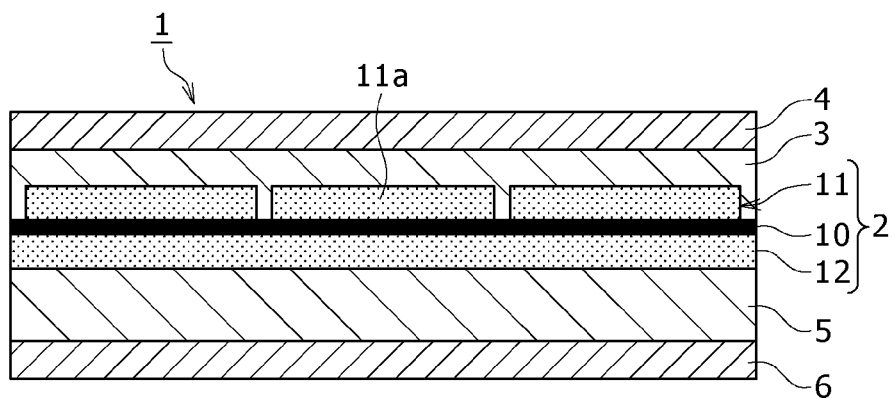

FIGS. 1A and 1B show a general configuration of a multilayer wiring board according to an embodiment of the present disclosure. More particularly, FIG. 1A is a top plan view of the multilayer wiring board of the present embodiment, and FIG. 1B is a sectional view taken along line a-a in FIG. 1A.

General Configuration of the Multilayer Wiring Board

Referring to FIGS. 1A and 1B, the multilayer wiring board 1 is a member in the form of a plate having a square surface shape. The multilayer wiring board 1 includes a pair of ports 1a and 1b which are input/output ports of a signal. The ports 1a and 1b are provided in the proximity of a pair of side portions of the multilayer wiring board 1 opposing to each other, in the example of FIG. 1A, of the left and right side portions. Particularly, the ports 1a and 1b are provided substantially at central portions in the extending direction of the corresponding side portions of the multilayer wiring board 1. Further, as seen in FIG. 1A, the ports 1a and 1b are disposed at positions at which they electrically contact with corresponding patch electrode portions 11a hereinafter described.

Further, as shown in FIG. 1B, the multilayer wiring board 1 includes a thin film member 2, a first interlayer insulating film 3, a first wiring film 4, a second interlayer insulating film 5, and a second wiring film 6 which is in the form of metal foil. It is to be noted that, in the multilayer wiring board 1 of the present embodiment, the first interlayer insulating film 3 and the first wiring film 4 are stacked in order on one of surfaces of the thin film member 2, namely, on the face on which a first conductive film 11 hereinafter described is formed. Further, in the present embodiment, the second interlayer insulating film 5 and the second wiring film 6 are stacked in order on the other surface of the thin film member 2, namely, on the surface on which a second conductive film 12 hereinafter described is formed. It is to be noted that the wiring films form wiring lines for an electronic part mounted on the multilayer wiring board 1.

In the present embodiment, the thin film member 2 is fabricated separately from fabrication of the multilayer wiring board 1. Then, midway of a process of stacking an interlayer insulating film and a wiring film, namely, a conductive film, to fabricate the multilayer wiring board 1, the thin film member 2 itself is stacked on a film such as the interlayer insulating film to fabricate the multilayer wiring board 1. Therefore, the thin film member 2 is provided not such that it is embedded in part of the mounting surface of the multilayer wiring board 1 for an electronic part but such that it is sandwiched or embedded in the inside of the multilayer wiring board 1 over the overall area of the mounting face of the multilayer wiring board 1 for an electronic part as seen in FIG. 1B.

Configuration of the Thin Film Member

Now, an internal configuration of the thin film member 2 is described. It is to be noted that an example wherein the thin film member 2 includes an AI-EBG structure is described.

Referring to FIG. 1B, the thin film member 2 includes an inorganic dielectric film 10, the first conductive film 11 and the second conductive film 12. It is to be noted that the first conductive film 11 is disposed or formed on one of the faces of the inorganic dielectric film 10 while the second conductive film 12 is disposed or formed on the other face of the inorganic dielectric film 10. Further, one of the first conductive film 11 and the second conductive film 12 is connected to a power supply of the power supply voltage VDD (voltage drain drain) while the other one of them is connected to a ground of the ground voltage GND.

The first conductive film 11 is configured from metal foil such as, for example, copper (Cu) foil. Meanwhile, the first conductive film 11 is not limited to the metal foil but may be configured from a conductive layer formed, for example, by plating, sputtering or vapor deposition.

The second conductive film 12 is configured from metal foil such as, for example, nickel (Ni) foil.

The inorganic dielectric film 10 is formed from an inorganic dielectric material of a high dielectric constant having a relative dielectric constant ∈r of approximately 500 to 2,000. In particular, the inorganic dielectric film 10 is formed from a material such as, for example, barium titanate (BTO), barium strontium titanate (BST), strontium titanate (STO) or lead zirconate titanate (PZT). By providing the thin film member 2 which includes such an inorganic dielectric film 10 of a high dielectric constant as just described over the overall area of the mounting face of the multilayer wiring board 1, the size of the EBG structure can be reduced. For example, as hereinafter described in connection with a performance validation 1, in the present embodiment, the size or area of the EBG structure can be reduced to a size of approximately $1/10$ to $1/100$ of the size of an existing EBG structure in which an organic dielectric film is used.

Further, in the present embodiment, the film thickness of the inorganic dielectric film 10 is set to approximately 0.1 to 2 μm. In the case where the thickness of the inorganic dielectric film 10 is reduced in this manner, a pass characteristic wherein a band gap does not appear and which attenuates over a wide range from a low frequency band to a high frequency band, namely, a characteristic which has a blocking region, is obtained, as hereinafter described in connection with a performance validation 2.

It is to be noted that, with an existing fabrication technique of a multilayer wiring board, namely, in a technique of successively stacking a dielectric film and a conductive film, it is difficult to fabricate the inorganic dielectric film 10 of the configuration described above. This is because there is the possibility that a heating process when the inorganic dielectric film 10 is formed may have a bad influence on a characteristic of the other organic dielectric films. However, by fabricating the thin film member 2 including the inorganic dielectric film 10 of a small thickness separately from the fabrication process of the multilayer wiring board 1 in advance as in the present embodiment, the subject of the fabrication technique in the past described hereinabove can be eliminated.

The first conductive film 11 is configured from a plurality of patch electrode portions 11a and a plurality of branch electrode portions 11b. In the example shown in FIG. 1A, nine patch electrode portions 11a are provided on the first conductive film 11 and formed in a square surface shape. Further, in the present embodiment, the nine patch electrode portions 11a are disposed in a matrix of 3 rows×3 columns in an equally spaced relationship from each other, namely, in a predetermined pattern corresponding to an EBG structure.

Further, in the example illustrated in FIG. 1A, two branch electrode portions 11b are provided each patch electrode portion 11a. It is to be noted that each branch electrode portion 11b has a square surface shape and has a width, namely, a length of one side, smaller than that of the patch electrode portion 11a and equal to the width of a region between two adjacent ones of the patch electrode portions 11a.

In the present embodiment, one of the two branch electrode portions 11b is provided at a predetermined corner portion of the corresponding patch electrode portion 11a, in the example illustrated in FIG. 1A, at a right upper corner portion. By this one branch electrode portion 11b, the two patch electrode portions 11a which are adjacent each other in the row direction are electrically connected to each other. Meanwhile, the other branch electrode portion 11b is provided at a corner portion opposing to the corner portion at which the one branch electrode portion 11b is provided in a diametrical direction of the corresponding patch electrode portion 11a, in the example shown in FIG. 1A, at the left lower corner portion. By the other branch electrode portion 11b, the two patch electrode portions 11a which are adjacent each other in the column direction are electrically connected to each other. It is to be noted that the disposition state of the patch electrode portions 11a and the branch electrode portions 11b, namely, the EBG structure pattern of the first conductive film 11, is not limited to the example shown in FIG. 1A, but is set suitably in accordance with a general shape and a size of the multilayer wiring board 1, a required attenuation characteristic, an application and so forth.

The second conductive film 12 is formed over the overall area of the multilayer wiring board 1. In the present embodiment, the inorganic dielectric film 10 is provided between the first conductive film 11 and the second conductive film 12 having the configuration described above to form an AI-EBG structure.

<2. Example of the Performance Validation of the Multilayer Wiring Board>

In the embodiment described hereinabove, the thin film member 2 including the inorganic dielectric film 10 of a high dielectric constant and a small film thickness, namely, the AI-EBG structure, is provided over the overall area of the mounting face of the multilayer wiring board 1 for an electronic part in the inside of the multilayer wiring board 1. Consequently, with the multilayer wiring board 1 of the embodiment described above, both of miniaturization of the EBG structure and expansion of the attenuation band can be anticipated. Here, the reason of this is described with reference to performance validations which were carried out for various multilayer wiring boards having the EBG structure.

Performance Validation 1

Figure 2A:
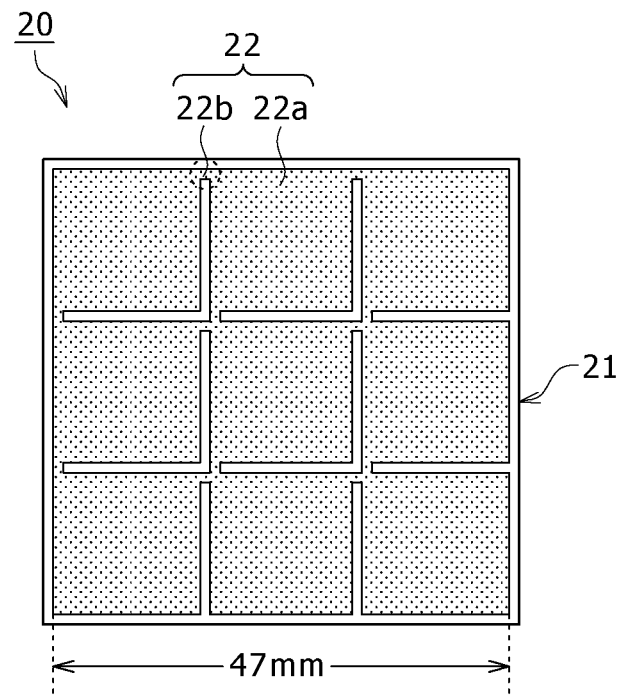
FIGS. 2A to 2C are schematic views showing a configuration of various samples of the multilayer wiring board used in a performance validation 1 of the multilayer wiring board.
Figure 2B:
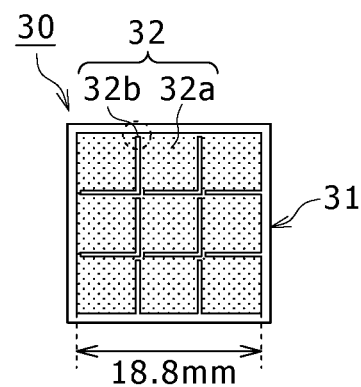
Figure 2C:
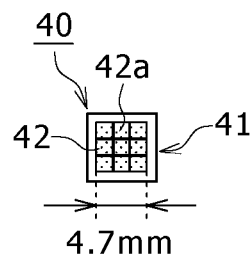

FIGS. 2A to 2C show schematic plan views of samples A to C of a multilayer wiring board which has an EBG structure and is used in a performance validation 1. It is to be noted that FIG. 2A is a schematic plan view of a thin film member 21 of a multilayer wiring board 20 of the sample A, and FIG. 2B is a schematic plan view of a thin film member 31 of a multilayer wiring board 30 of the sample B. Further, FIG. 2C is a schematic plan view of a thin film member 41 of a multilayer wiring board 40 of the sample C. It is to be noted that, for the convenience of illustration, the branch electrode portion is not shown.

(1) Sample A

The EBG structure in the thin film member 21 of the sample A is similar to that of the thin film member 2 of the configuration described hereinabove with reference to FIGS. 1A and 1B, namely, the AI-EBG structure. In particular, nine patch electrode portions 22a of a square surface shape are provided on a first conductive film 22 and disposed in an equally spaced relationship from each other in a matrix or patch pattern of 3 rows×3 columns as shown in FIG. 2A.

Also in the sample A, two adjacent ones of the patch electrode portions 22a are electrically connected to each other by a branch electrode portion 22b of a square surface shape. Further, though not shown, also the second conductive film in the sample A is formed over the overall area of the multilayer wiring board 20 similarly as in the embodiment described hereinabove. Further, though not shown, also in the sample A, input/output ports for a signal are provided in a similar manner as in the case of the multilayer wiring board 1 shown in FIG. 1A.

In the sample A, the dielectric film not shown provided between the first conductive film 22 and the second conductive film not shown is formed from a dielectric film having a relative dielectric constant ∈r of 4.5 such as, for example, an organic dielectric film made of a FR4 (Flame Retardant Type 4) material. Meanwhile, the thickness t of the dielectric film in the sample A is 50 μm. Furthermore, the width of the patch electrode portions 22a of the sample A, namely, the length of one side and hence the patch size of the patch electrode portions 22a, is 15 mm, and the width of the branch electrode portion 22b, namely, the branch size, is 1 mm. Therefore, the overall width of the first conductive film 22 of the sample A is 47 mm as shown in FIG. 2A.

(2) Sample B

In the sample B, the dielectric film not shown provided between a first conductive film 32 and a second conductive film not shown is formed from a dielectric film having a relative dielectric constant ∈r of 30 such as, for example, a dielectric film made of a high-dielectric constant material called High-k. Meanwhile, the thickness t of the dielectric film in the sample B is 16 μm. Furthermore, the width of a patch electrode portion 32a of the sample B is 6.0 mm, and the width of a branch electrode portion 32b is 0.4 mm. Therefore, the overall width of the first conductive film 32 of the sample B is 18.8 mm as shown in FIG. 2B.

It is to be noted that the configuration of the sample B other than the relative dielectric constant ∈r and the film thickness t of the dielectric film and the size of the patch electrode portion 32a and the branch electrode portion 32b of the first conductive film 32 described hereinabove, for example, the shape, arrangement and so forth of the electrode portions, is similar to that of the sample A.

(3) Sample C

In the sample C, the dielectric not shown provided between a first conductive film 42 and a second conductive film not shown is a dielectric film of a relative dielectric constant ∈r of 500, for example, a dielectric film made of an inorganic dielectric material. Further, the thickness t of the dielectric film in the sample C is 16 μm. Further, the width of a patch electrode portion 42a is 1.5 mm, and the width of the branch electrode portions is 0.1 mm. Therefore, the overall width of the first conductive film 42 is 4.7 mm as shown in FIG. 2C.

It is to be noted that the configuration of the sample C other than the relative dielectric constant ∈r and the film thickness t of the dielectric film and the size of the patch electrode portion 42a and the branch electrode portion of the first conductive film 42 described hereinabove, for example, the shape, arrangement and so forth of the electrode portions, is similar to that of the sample A.

Here, a table in which the structures of the multilayer wiring boards of the samples A to C described hereinabove are described is indicated as Table 1 below.

TABLE 1

| Sample | Dielectric film | Patch pattern | Patch size | Branch size | Dielectric film thickness | ∈r |
|---|---|---|---|---|---|---|
| A | FR4 | 3 × 3 | 15 mm | 1 mm | 50 μm | 4.5 |
| B | High-k | 3 × 3 | 6.0 mm | 0.4 mm | 16 μm | 30 |
| C | Inorganic | 3 × 3 | 1.5 mm | 0.1 mm | 16 μm | 500 |

(4) Pass Characteristic

Figure 3:
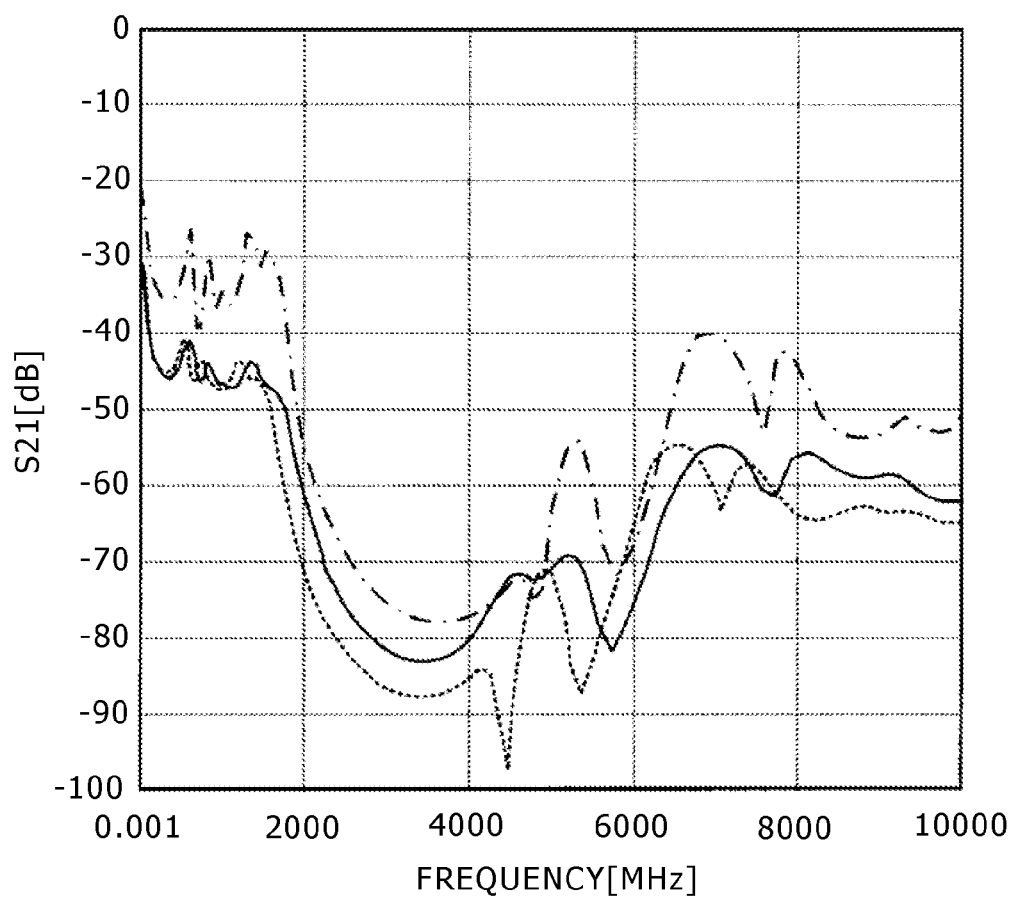
FIG. 3 is a view illustrating a result of the performance validation 1 of the multilayer wiring board having an EBG structure.

FIG. 3 illustrates a result of a validation experiment, namely, a simulation, of a pass characteristic of a signal between the input and output ports of the samples A to C. It is to be noted that the characteristic indicated by an alternate long and short dash line in FIG. 3 is the pass characteristic of the sample A, namely, the multilayer wiring board 20; the characteristic indicated by a broken line is the pass characteristic of the sample B, namely, the multilayer wiring board 30; and the characteristic indicated by a solid line is the pass characteristic of the sample C, namely, the multilayer wiring board 40. Further, the axis of ordinate of the characteristic indicated in FIG. 3 indicates the S parameter which represents the pass characteristic (S21) of the multilayer wiring board, and the axis of abscissa indicates the frequency.

As can be seen apparently from FIG. 3, also in the multilayer wiring boards of the samples A to C, a band gap appears in a substantially same frequency band, and among the multilayer wiring boards of the samples A to C, a substantially same attenuation characteristic is obtained.

From this result, it can be recognized that, in the case where an inorganic dielectric film is adopted as a dielectric film in order to achieve a predetermined pass characteristic, namely, a predetermined attenuation characteristic, or in other words, in the case of the sample C, the area of the EBG structure can be reduced approximately to ¹/₁₀₀ from that in the case where the dielectric film is formed from a FR4 material like the sample A. Further, in the case where the sample B in which the dielectric film is formed from a High-k material is compared with the sample C, the area of the EBG structure of the sample C can be reduced approximately to ¹/₁₆ from that of the sample B.

From the result of the performance validation 1 described above, it can be recognized that, by configuring a dielectric film, which configures an EBG structure, from an inorganic dielectric film of a high dielectric constant as in the case of the multilayer wiring board 1 of the embodiment described hereinabove, the size of the EBG structure can be reduced or miniaturized.

Performance Validation 2

Next, in a multilayer wiring board having an EBG structure pattern similar to that of the embodiment described hereinabove, namely, having the EBG structure pattern described hereinabove with reference to FIG. 1A, a variation of the pass characteristic when the film thickness of a dielectric film which configures an EBG structure is changed, is investigated.

In particular, also in various samples D to F to be described below of a multilayer wiring board used in a performance validation 2, a first conductive film is configured from nine patch electrode portions of a square surface shape, and a branch electrode portion which electrically connects each two adjacent patch electrode portions to each other. In the various samples to be described below, the nine patch electrode portions are disposed in a matrix of 3 rows×3 columns and in an equally spaced relationship from each other. Further, in the various samples D to F used in the performance validation 2, the width of the patch electrode portions is 6.0 mm, and the width of the branch electrode portions is 0.4 mm.

(1) Sample D

In the multilayer wiring board, namely, the thin film member, in the sample D, the relative dielectric constant ∈r of a dielectric film which configures an EBG structure, namely, of a dielectric film disposed between a first conductive film and a second conductive film, is 4.5 similarly as in the case of the sample A. Further, in the sample D, the film thickness t of the dielectric films is 16 μm (sample D-1) or 0.6 μm (sample D-2), and the pass characteristic of the samples is calculated by a simulation.

Figure 4A:
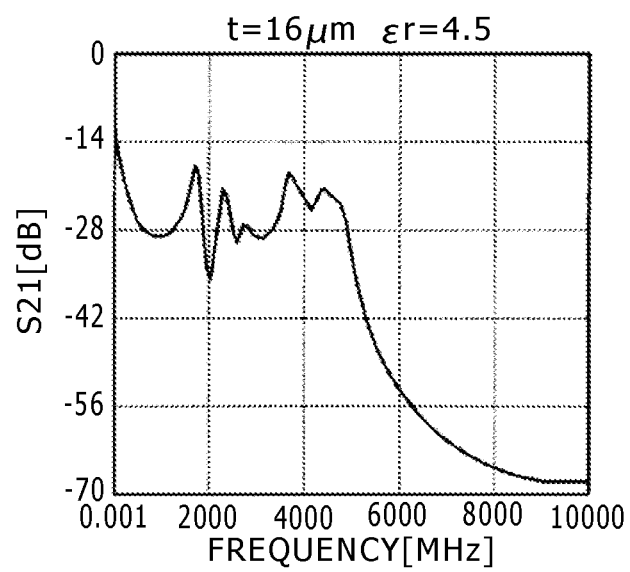
FIGS. 4A and 4B are views illustrating results of a performance validation 2 of the multilayer wiring board having an EBG structure.
Figure 4B:
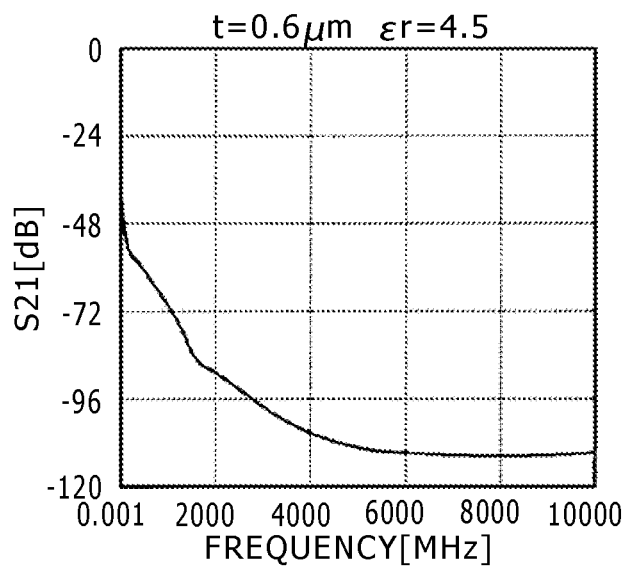

FIGS. 4A and 4B illustrate a variation of the pass characteristic in the case where the film thickness t of the dielectric films is changed in the multilayer wiring boards of the sample D. FIG. 4A illustrates a pass characteristic of the sample D-1 where t=16 μm, and FIG. 4B is a pass characteristic of the sample D-2 where t=0.6 μm. It is to be noted that the axis of ordinate of the pass characteristics illustrated in FIGS. 4A and 4B indicates the parameter (S21) representative of the pass characteristic, and the axis of abscissa indicates the frequency.

It can be seen apparently from the pass characteristics of FIGS. 4A and 4B that, if the film thickness t of the dielectric film in the multilayer wiring board of the sample D wherein the relative dielectric constant ∈r is 4.5 decreases, then the band gap disappears. Further, it can be seen that, in the pass characteristic of the sample D-2 illustrated in FIG. 4B, the attenuation amount is greater over a wide range from a lower frequency band of several MHz than the pass characteristic of the sample D-1 illustrated in FIG. 4A, namely, the value of the parameter S21 is lower. In other words, in the multilayer wiring board of the sample D, the attenuation band can be expanded by reducing the film thickness t of the dielectric films.

(2) Sample E

In the multilayer wiring board, namely, the thin film member, in the sample E, the relative dielectric constant ∈r of a dielectric film which configures an EBG structure is 30 similarly as in the case of the sample B. Further, in the sample E, the film thickness t of the dielectric films is 100 μm (sample E-1), 16 μm (sample E-2) or 0.6 μm (sample E-3), and the pass characteristic of the samples is calculated by a simulation.

Figure 5A:
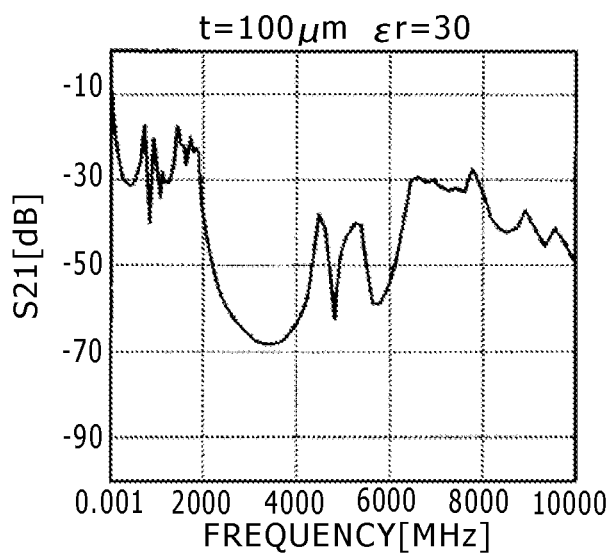
FIGS. 5A to 5C are views illustrating results of the performance validation 2 of the multilayer wiring board having an EBG structure.
Figure 5B:
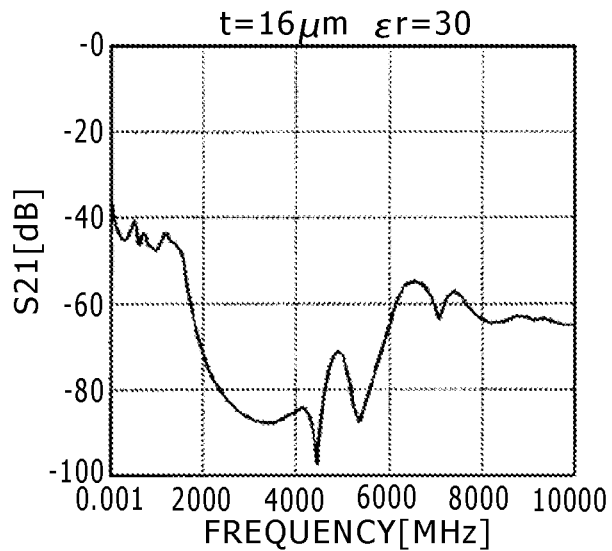
Figure 5C:
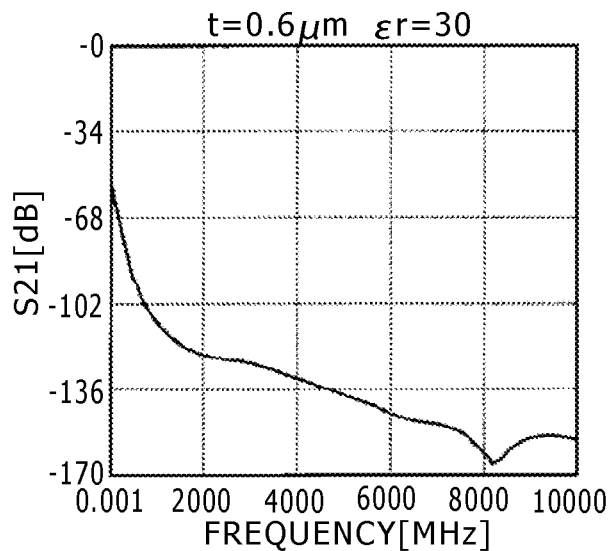

FIGS. 5A to 5C illustrate a variation of the pass characteristic in the case where the film thickness t of the dielectric films is changed among the multilayer wiring boards of the sample E. FIG. 5A illustrates a pass characteristic of the sample E-1 where t=100 μm; FIG. 5B illustrates a pass characteristic of the sample E-2 where t=16 μm; and FIG. 5C is a pass characteristic of the sample E-3 where t=0.6 μm. It is to be noted that the axis of ordinate of the pass characteristics illustrated in FIGS. 5A to 5C indicates the parameter (S21) representative of the pass characteristic and the axis of abscissa indicates the frequency.

It can be seen apparently from the pass characteristics of FIGS. 5A to 5C that, if the film thickness t of the dielectric films in the multilayer wiring boards of the sample E wherein the relative dielectric constant ∈r is 30 decreases, then the band gap disappears. Further, it can be seen that, in the pass characteristic of the sample E-3 illustrated in FIG. 5C, namely, in the pass characteristic from which the band gap disappears, the attenuation amount is greater over a wide range from a lower frequency band of several MHz, namely, the value of the parameter S21 is lower. More particularly, it can be seen apparently that, in the pass characteristic illustrated in FIG. 5C, the attenuation amount is greater over a range from a frequency lower than the frequency on the low frequency side of a band gap of the pass characteristic illustrated in FIG. 5B to a frequency higher than the frequency on the high frequency side of the band gap. In other words, it can be recognized that, also with the multilayer wiring board of the sample E, the attenuation band can be expanded by reducing the film thickness t of the dielectric films similarly as in the case of the sample D.

(3) Sample F

In the multilayer wiring board, namely, the thin film member, in the sample F, the relative dielectric constant ∈r of the dielectric films which configure the EBG structure is 500 similarly as in the case of the sample C. Further, in the sample F, the film thickness t of the dielectric films is 16 μm (sample F-1) or 0.6 μm (sample F-2), and the pass characteristic of the samples is calculated by a simulation.

Figure 6A:
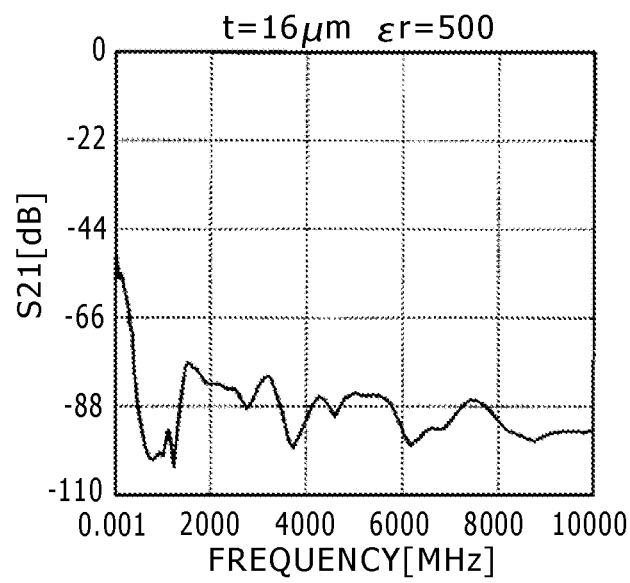
FIGS. 6A and 6B are views illustrating results of the performance validation 2 of the multilayer wiring board having an EBG structure.
Figure 6B:
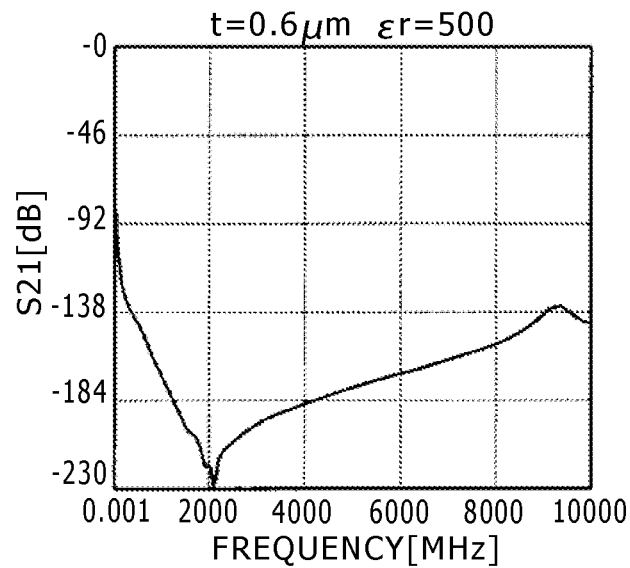

FIGS. 6A and 6B illustrate a variation of the pass characteristic in the case where the film thickness t of the dielectric films is changed between the multilayer wiring boards of the sample F. FIG. 6A illustrates a pass characteristic of the sample F-1 where t=16 μm, and FIG. 6B is a pass characteristic of the sample F-2 where t=0.6 μm. It is to be noted that the axis of ordinate of the pass characteristics illustrated in FIGS. 6A and 6B indicates the parameter (S21) representative of the pass characteristic and the axis of abscissa indicates the frequency.

It can be seen apparently from the pass characteristics of FIGS. 6A and 6B that, also in the multilayer wiring boards of the sample F wherein the relative dielectric constant ∈r is 500, if the film thickness t of the dielectric films decreases, then the band gap disappears. Further, it can be seen that, in the pass characteristic of the sample F-2 illustrated in FIG. 6B, namely, in the pass characteristic from which the band gap disappears, the attenuation amount is greater over a wide range from a lower frequency band of several MHz, namely, the value of the parameter S21 is lower. More particularly, it can be seen that, in the pass characteristic illustrated in FIG. 6B, the attenuation amount is greater over a range from a frequency lower than the frequency on the low frequency side of a band gap of the pass characteristic illustrated in FIG. 6A to a frequency higher than the frequency on the high frequency side of the band gap. In other words, it can be recognized that, also with the multilayer wiring board of the sample F, the attenuation band can be expanded by reducing the film thickness t of the dielectric films similarly as in the cases of the sample D and E.

From the result of the performance validation 2 described above, it can be recognized that, by reducing the film thickness of a dielectric film, which configures an EBG structure, the attenuation band can be expanded. Further, as apparently seen from the results of FIGS. 4A, 5B and 6A, it can be recognized that, as the relative dielectric constant ∈r of the dielectric films increases, the frequency at which the attenuation amount begins to become equal to or lower than, for example, −50 dB, namely, the frequency of the band gap on the low frequency side, shifts to the lower frequency side.

Performance Validation 3

Further, in the present embodiment, the pass characteristic of the multilayer wiring board having an EBG structure pattern shown in FIG. 2C, namely, the sample C wherein the relative dielectric constant ∈r=500 and the film thickness t of the dielectric=16 μm, was checked when the film thickness of the dielectric films configuring the EBG structure, namely, the inorganic dielectric films, was reduced. In particular, in the configuration of the sample C, the film thickness t of the dielectric film configuring the EBG structure, namely, the dielectric film between the first conductive film and the second conductive film, was reduced to 0.6 μm (sample G), and the pass characteristic of the sample was calculated by a simulation. It is to be noted that, in this simulation, noise of 1 V was applied from an input port not shown to carry out the calculation.

Figure 7:
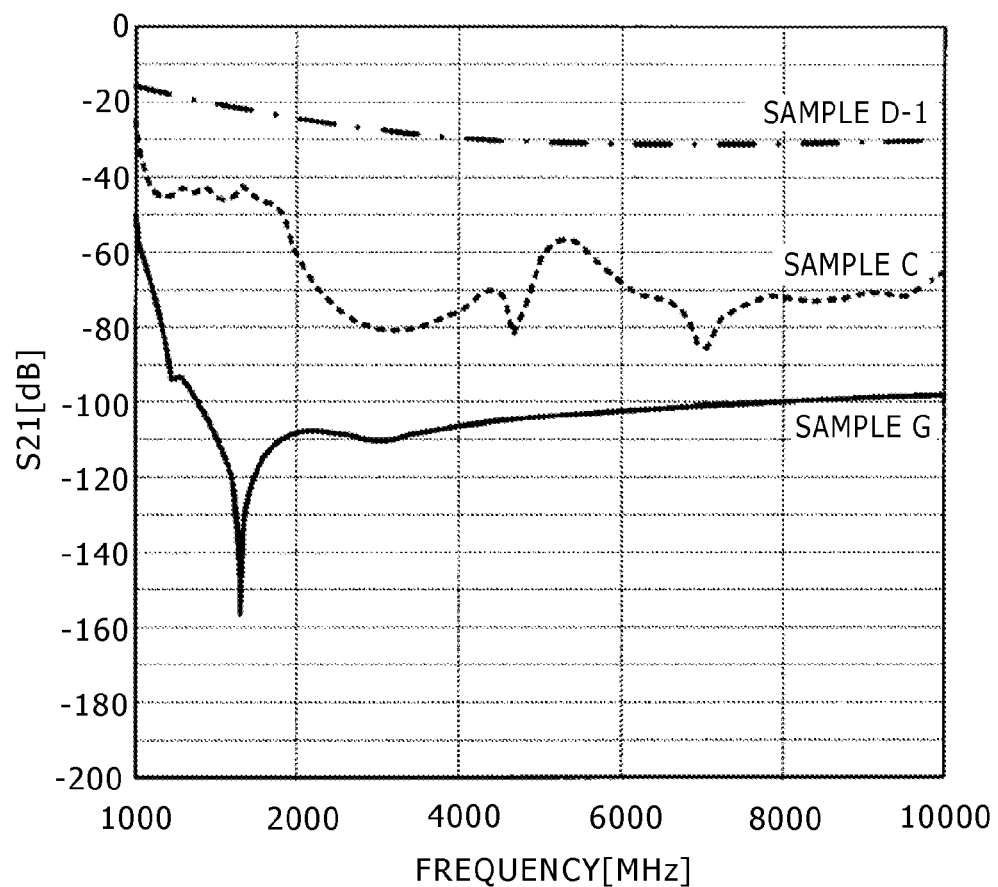
FIG. 7 is a view illustrating a result of a performance validation 3 of the multilayer wiring board having an EBG structure.

FIG. 7 illustrates a result of the simulation of the pass characteristic of the sample G. It is to be noted that the axis of ordinate of the pass characteristic indicated in FIG. 7 indicates the S parameter (S21) which represents the pass characteristic of the multilayer wiring board, and the axis of abscissa indicates the frequency. Further, FIG. 7 illustrates not only the pass characteristic of the sample G indicated by a solid line but also a pass characteristic of the sample C indicated by a broken line and a pass characteristic of the sample D-1, wherein the relative dielectric constant ∈r=4.5 and the film thickness t of the dielectric=16 μm, indicated by an alternate long and short dash line, for comparison.

As apparently seen from FIG. 7, it can be recognized that the pass characteristic of the sample G exhibits an attenuation amount which is greater over a wide range from a low frequency to a high frequency than that of the sample C.

From the results of the performance validations 1 to 3, it can be recognized that, by configuring a dielectric film, which configures an EBG structure, from an inorganic dielectric film of a high dielectric constant and besides forming the dielectric film thin, both of miniaturization of the EBG structure and expansion of the attenuation band can be anticipated.

Further, in the embodiment described above, the thin film member 2 including the inorganic dielectric film 10 which configures the EBG structure is fabricated separately from the fabrication of the multilayer wiring board 1 as described hereinabove. Then, the thin film member 2 itself is provided in a sandwiched manner in the inside of the multilayer wiring board 1 over the overall area of the mounting face of the multilayer wiring board 1 for an electronic part. In the multilayer wiring board 1 having such a configuration as just described, namely, in the multilayer wiring board 1 fabricated in accordance with the technique described above, it is easy to reduce the film thickness of the inorganic dielectric film 10 which configures the EBG structure, and both of miniaturization of the EBG structure and expansion of the attenuation band can be achieved comparatively simply.

It is to be noted that, although validation results are not exemplified, the relationship between the parameters of the area of the patch electrode portions of the first conductive film, the relative dielectric constant of the dielectric film and the film thickness of the dielectric film and the pass characteristic was further checked. As a result, it was found that the lower limit value of the attenuation band, namely, the low frequency band, can be varied through the parameters mentioned. In other words, it was found that a predetermined attenuation characteristic, namely, a blocking performance of EMI, can be generated in a desired frequency band by suitably setting the parameters at the design stage of a multilayer wiring board.

Working Example

Here, a configuration of a working example of the multilayer wiring board according to the present disclosure fabricated actually is described with reference to FIG. 8. It is to be noted that FIG. 8 is a top plan view of a multilayer wiring board 50 of the working example.

The multilayer wiring board 50 of the working example includes a thin film member 51 having an AI-EBG structure and a pair of ports 52 and 53.

Figure 8:
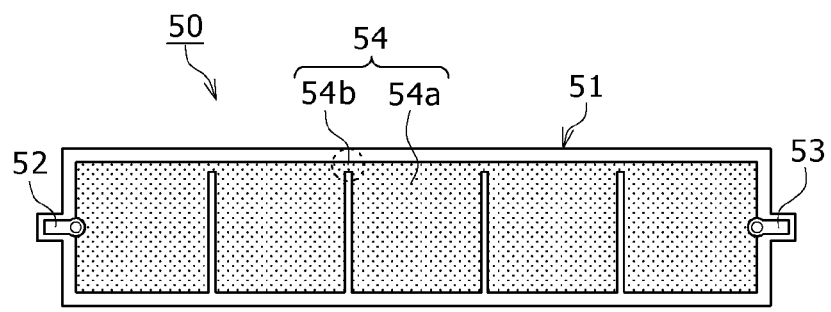
FIG. 8 is a schematic view showing a configuration of a multilayer wiring board of a working example.

The thin film member 51 is in the form of a plate of a substantially rectangular face shape as shown in FIG. 8. The thin film member 51 is configured from an inorganic dielectric film not shown, a first conductive film 54 and a second conductive film not shown. Similarly as in the embodiment described hereinabove with reference to FIG. 1B, the first conductive film 54 is formed on one of faces of the inorganic dielectric film while the second conductive film is formed on the other face of the inorganic dielectric film. Further, in the present working example, one of the first conductive film 54 and the second conductive film is connected to the power supply while the other of them is connected to the ground.

In the present example, the inorganic dielectric film was formed from barium titanate of a relative dielectric constant ∈r of approximately 1,000 and a film thickness of 1.0 μm.

The first conductive film 54 is configured from five patch electrode portions 54a and four branch electrode portions 54b as shown in FIG. 8. It is to be noted that, in the present example, both of the surface shape of the patch electrode portions 54a and the surface shape of the branch electrode portions 54b are a square shape. Further, in the present example, the five patch electrode portions 54a are disposed in a row along the extending direction of the major side of the thin film member 51 and in an equally spaced relationship from each other. Further, each of the branch electrode portions 54b is provided at one end portion, in the example shown in FIG. 8, at an upper end portion, of an opposing region between two ones of the patch electrode portions 54a which are adjacent each other. Consequently, the two patch electrode portions 54a disposed adjacent each other are electrically connected to each other.

In the present example, the width, namely, the length of one side, of the patch electrode portion 54a is 1.5 mm, and the width of the branch electrode portion 54b is 0.1 mm. Therefore, the overall width of the first conductive film 54, namely, the distance between the port 52 and the port 53 is 7.9 mm.

Further, though not shown in FIG. 8, also the second conductive film in the present example was formed over the overall area of the multilayer wiring board 50, namely, of the thin film member 51, similarly as in the embodiment described hereinabove with reference to FIG. 1B. It is to be noted that, in the present example, the first conductive film 54 was formed from copper and the second conductive film was formed from nickel.

The ports 52 and 53 are provided on a pair of opposing minor side portions of the multilayer wiring board 50. In particular, each of the ports 52 and 53 is provided in the proximity of the center in an extending direction of the corresponding minor side portion. It is to be noted that the port 52 is disposed at a position at which it is electrically connected to a patch electrode portion 54a provided on one of the minor side portions, in FIG. 8, on the left side portion, of the thin film member 51 as shown in FIG. 8. Meanwhile, the port 53 is disposed at a position at which it electrically connects to a patch electrode portion 54a provided on the other minor side portion, in FIG. 8, on the right side portion, of the thin film member 51.

Comparative Example

Figure 9:
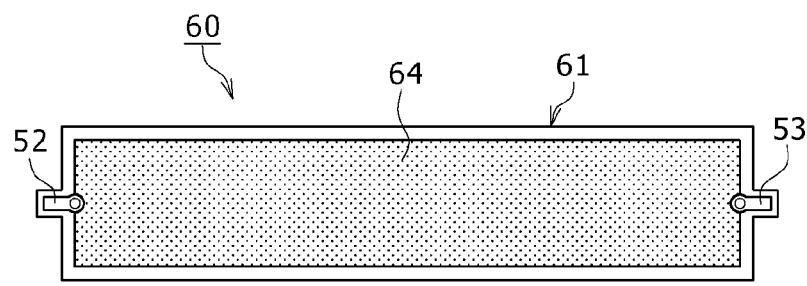
FIG. 9 is a schematic view showing a configuration of a multilayer wiring board of a comparative example.

Here, a configuration of a multilayer wiring board of a comparative example fabricated for the comparison in pass characteristic with the multilayer wiring board 50 of the working example described above is shown in FIG. 9. It is to be noted that FIG. 9 is a top plan view of a multilayer wiring board 60 of the comparative example, like elements of the multilayer wiring board 60 of the comparative example shown in FIG. 9 to those of the multilayer wiring board 50 of the working example shown in FIG. 8 are denoted by like reference symbols.

The multilayer wiring board 60 of the comparative example includes a thin film member 61 and a pair of ports 52 and 53. As apparently seen from comparison between FIGS. 9 and 8, the comparative example is different from the working example in configuration of the first conductive film 64 of the thin film member 61. In particular, in the comparative example, an EBG structure is not provided, but the first conductive film 64 is configured from an electrode film (hereinafter referred to as plane electrode film) formed over the substantially overall area of the thin film member 61. It is to be noted that the comparative example is similar in configuration to the working example except the configuration of the first conductive film 64.

Measurement Result

A result of measurement of the pass characteristic carried out for the multilayer wiring boards of the working example and the comparative example of the configurations described above is illustrated in FIG. 10. It is to be noted that the axis of ordinate of the characteristics indicated in FIG. 10 indicates the S parameter (S21) which represents the pass characteristic of the multilayer wiring board, and the axis of abscissa indicates the frequency. Further, a characteristic indicated by a solid line in FIG. 10 is the pass characteristic of the multilayer wiring board 50 of the working example and another characteristic indicated by a broken line is the pass characteristic of the multilayer wiring board 60 of the comparative example.

Figure 10:
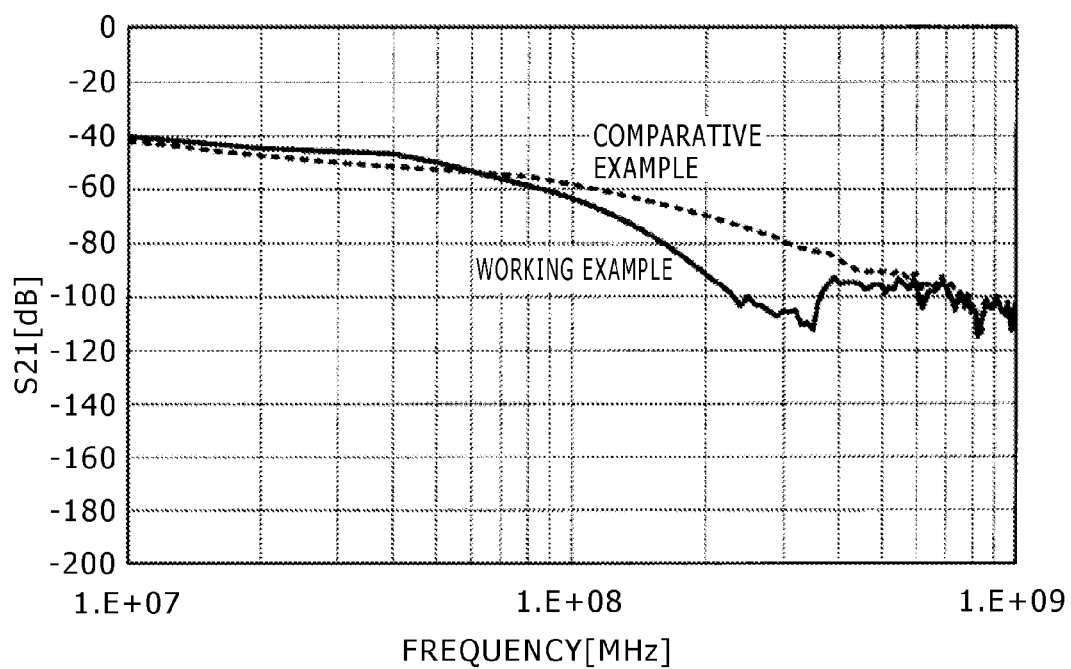
FIG. 10 is a view illustrating pass characteristics of multilayer wiring boards fabricated by the working example and the comparative example.

As apparent from FIG. 10, it can be recognized that, in the working example, the attenuation amount is greater and an attenuation amount of approximately −100 dB is obtained in a frequency equal to or higher than approximately 200 MHz in comparison with that of the comparative example. In other words, it can be recognized that, with the multilayer wiring board 50 of the present working example, the frequency on the low frequency side of the attenuation band, namely, the lower limit value of the attenuation band, is lower than that in the comparative example, and the attenuation band can be expanded.

<3. Modification>

The configuration of the multilayer wiring board, particularly the EBG structure, according to the present disclosure is not limited to those of the embodiment and the working example described hereinabove with reference to FIGS. 1A and 1B and FIG. 8, respectively, but various modifications are possible. In the following, various modifications are described.

Modification 1

While, in the embodiment and the working example described hereinabove, a multilayer wiring board which includes a thin film member of the Al-EBG structure is taken as an example, the present disclosure is not limited to this. The EBG structure may have a structure of the mushroom type, and a modification 1 is described as an example of this.

Figure 11A:
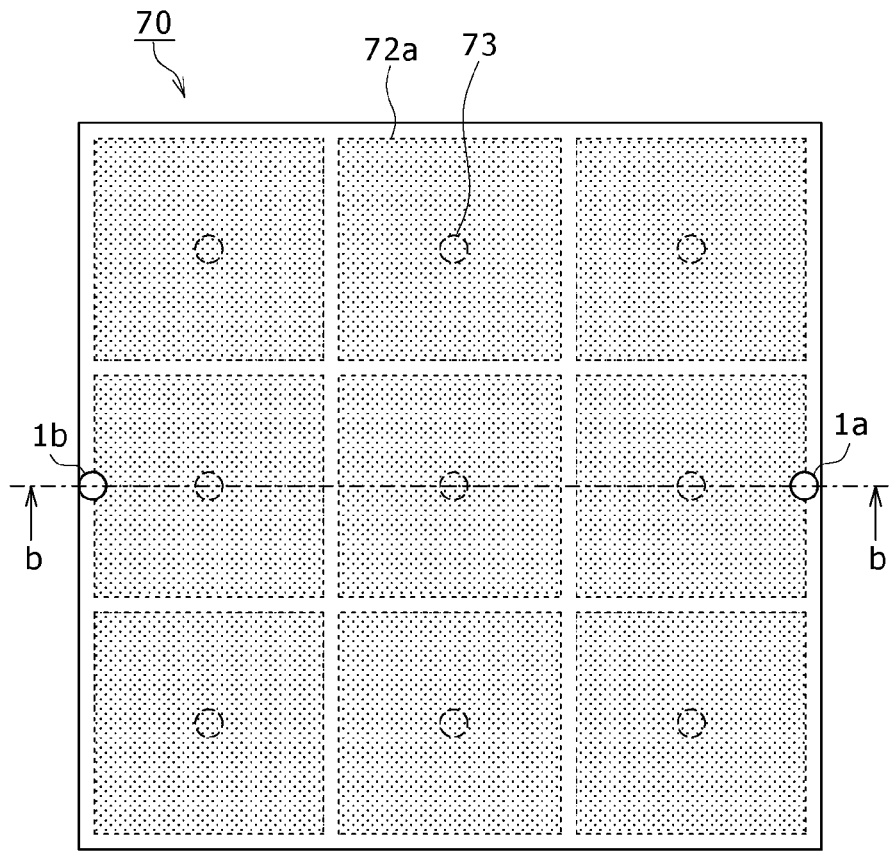
FIGS. 11A and 11B are schematic views showing a configuration of a multilayer wiring board of a modification 1.
Figure 11B:
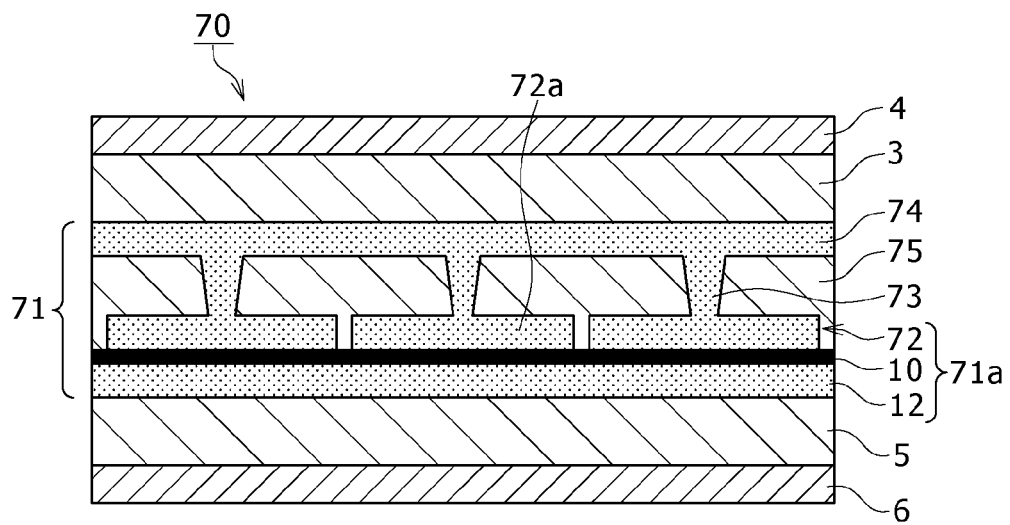

FIGS. 11A and 11B show a general configuration of a multilayer wiring board of the modification 1. It is to be noted that FIG. 11A is a top plan view of the multilayer wiring board 70 of the modification 1, and FIG. 11B is a sectional view taken along line b-b of FIG. 11A. Further, in the multilayer wiring board 70 of the present example shown in FIGS. 11A and 11B, like elements to those of the multilayer wiring board 1 of the embodiment described hereinabove with reference to FIGS. 1A and 1B are denoted by like reference symbols.

As apparent from comparison between FIGS. 11A and 11B and FIGS. 1A and 1B, the multilayer wiring board 70 in the modification 1 is similar to the multilayer wiring board 1 of the embodiment except that the configuration of the filter structure section including the thin film member is modified. Therefore, description here is given only of the configuration of the filter structure section 71 including a thin film member 71a while description of the configuration of the remaining part is omitted.

Referring to FIG. 11B, the filter structure section 71 includes a thin film member 71a, a plurality of via electrode portions or vertical hole electrodes 73, a plane electrode film 74, and a third interlayer insulating film 75. Further, the thin film member 71a is configured from an inorganic dielectric film 10, a first conductive film 72 and a second conductive film 12.

In the present example, the first conductive film 72 is formed on one of faces of the inorganic dielectric film 10 while the second conductive film 12 is formed on the other face of the inorganic dielectric film 10. It is to be noted that the inorganic dielectric film 10 is configured from an inorganic dielectric film of a high dielectric constant having a relative dielectric constant ∈r of approximately 500 to 2,000 and a film thickness of approximately 0.1 to 2 μm similarly as in the embodiment described hereinabove. Further, the second conductive film 12 is configured from metal foil, for example, of nickel (Ni) and formed over the overall area of the multilayer wiring board 70 similarly as in the embodiment described hereinabove.

The first conductive film 72 is configured from nine patch electrode portions 72a having a square surface shape as shown in FIG. 11A. Further, in the present example, the nine patch electrode portions 72a are disposed in a matrix of 3 rows×3 columns and in an equally spaced relationship from each other. It is to be noted that, since the EBG structure in the present example is an EBG structure of the mushroom type, the patch electrode portions 72a are not electrically connected to each other by such branch electrode portions as in the embodiment described hereinabove. Further, the first conductive film 72 is configured from metal foil or a conductive layer made of, for example, copper (Cu).

The plane electrode film 74 is stacked on the first conductive film 72 with the third interlayer insulating film 75 interposed therebetween. The via electrode portions 73 are formed in such a manner as to extend in the thickness-wise direction through the third interlayer insulating film 75 and provided one by one for the patch electrode portions 72a. It is to be noted that each of the via electrode portions 73 is connected at one end portion thereof to the center of a corresponding one of the patch electrode portions 72a and at the other end portion thereof to the plane electrode film 74. Thus, in the present example, the plane electrode film 74 and the patch electrode portions 72a are electrically connected to each other.

Further, in the present example, one of the plane electrode film 74 and the second conductive film 12 is connected to the power supply while the other of them is connected to the ground. In other words, the first conductive film 72 is connected to the power supply or the ground through the plane electrode film 74.

It is to be noted that the multilayer wiring board 70 of the present example is fabricated in the following manner. First, the thin film member 71a is fabricated separately from the fabrication of the multilayer wiring board 70 similarly as in the embodiment described hereinabove. Then, midway of the process of stacking an interlayer insulating film and a wiring film, namely, a conductive film, to fabricate the multilayer wiring board 70, the thin film member 71a itself is stacked on such a film as, for example, the interlayer insulating film. Then, the third interlayer insulating film 75, via electrode portions 73 and plane electrode film 74 are formed on the thin film member 71a by a buildup process in the past. Then, the multilayer wiring board 70 is fabricated by stacking the first interlayer insulating film 3 and the first wiring film 4 in order on the plane electrode film 74. The thin film member 71a is provided in such a manner as to be sandwiched or embedded in the inside of the multilayer wiring board 70 over the overall area of the mounting face of the multilayer wiring board 70 for an electronic part.

As described above, also in the present example, the filter structure section 71 of an EBG structure of the mushroom type including the inorganic dielectric film 10 of a high dielectric constant and a small film thickness is provided over the overall area of the mounting face of the multilayer wiring board 70 for an electronic part in the multilayer wiring board 70. Further, the multilayer wiring board 70 can be fabricated similarly as in the embodiment as described hereinabove. Therefore also in the present example, effects similar to those achieved by the embodiment described hereinabove can be achieved.

Modification 2

In the embodiment and the working example described hereinabove, an example wherein an EBG structure is provided in a multilayer wiring board over an overall area of the mounting face of the multilayer wiring board for an electronic part is described. However, the present disclosure is not limited to this. An EBG structure may be provided otherwise at part of a mounting face of a multilayer wiring board for an electronic part while a uniform electrode film (hereinafter referred to as plane electrode portion) is provided over the overall area of the other region of the mounting face. An example of this is described below as a modification 2.

Figure 12A:
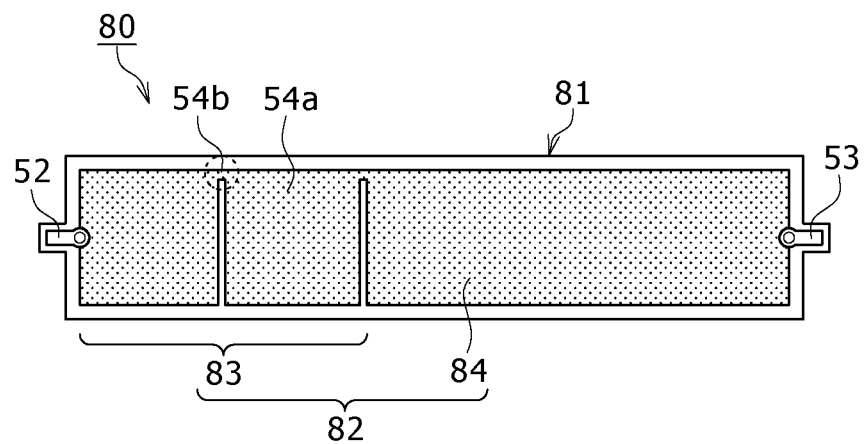
FIGS. 12A and 12B are schematic views showing a configuration of a multilayer wiring board of a modification 2.
Figure 12B:
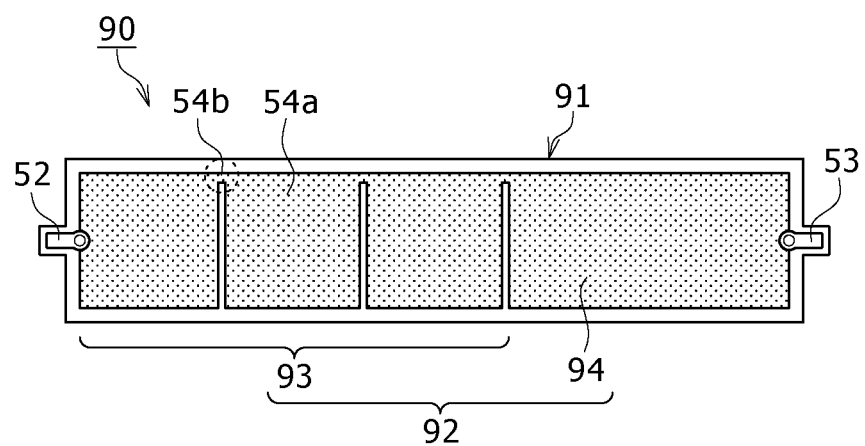

FIGS. 12A and 12B show a general configuration of a multilayer wiring board of the modification 2. It is to be noted that FIG. 12A is a top plan view of a multilayer wiring board in the case where the formation area of an EBG structure on a mounting face of the multilayer wiring board for an electronic part is smaller than the formation area for a plane electrode portion, namely, a modification 2-1. Meanwhile, FIG. 12B is a top plan view of a multilayer wiring board in the case where the formation area of an EBG structure on a mounting face of the multilayer wiring board for an electronic part is greater than the formation area for a plane electrode portion, namely, a modification 2-2. Further, in the multilayer wiring boards of the present example shown in FIGS. 12A and 12B, like elements to those of the multilayer wiring board 50 of the working example described hereinabove with reference to FIG. 8 are denoted by like reference symbols.

(1) Modification 2-1

As apparent from comparison between FIGS. 12A and 8, the multilayer wiring board 80 of the modification 2-1 is similar to that of the working example described hereinabove except in configuration of a first conductive film 82. Therefore, description is given here only of the configuration of the first conductive film 82 while description of the configuration of the other part is omitted.

In the modification 2-1, the first conductive film 82 is configured from an EBG structure electrode portion 83 and a plane electrode portion 84. It is to be noted that the EBG structure electrode portion 83 is disposed on one port 52 side while the plane electrode portion 84 is disposed on the other port 53 side. Further, in the present example, the EBG structure electrode portion 83 and the plane electrode portion 84 are sized such that the formation area of the EBG structure electrode portion 83 is smaller than the formation area of the plane electrode portion 84.

The EBG structure electrode portion 83 is configured from two patch electrode portions 54a and two branch electrode portions 54b. The two patch electrode portions 54a are disposed in a row along the extending direction of the major side of a thin film member 81 and in an equally spaced relationship from each other.

One of the two branch electrode portions 54b is provided at one end portion of the opposing region of the two patch electrode portions 54a which are adjacent each other, in the example shown in FIG. 12A, at an upper end portion of the opposing region. Meanwhile, the other branch electrode portion 54b is provided at one end portion of the opposing region of the EBG structure electrode portion 83 and the plane electrode portion 84. Consequently, the patch electrode portions 54a which are adjacent each other are electrically connected to each other and the EBG structure electrode portion 83 and the plane electrode portion 84 are electrically connected to each other.

(2) Modification 2-2

As apparent from comparison between FIGS. 12B and 8, the multilayer wiring board 90 of the modification 2-2 is similar to that of the working example described hereinabove except in configuration of a first conductive film 92. Therefore, description is given here only of the configuration of the first conductive film 92 while description of the configuration of the other part is omitted.

In the modification 2-2, the first conductive film 92 is configured from an EBG structure electrode portion 93 and a plane electrode portion 94. It is to be noted that the EBG structure electrode portion 93 is disposed on one port 52 side while the plane electrode portion 94 is disposed on the other port 53 side. Further, in the present example, the EBG structure electrode portion 93 and the plane electrode portion 94 are sized such that the formation area of the EBG structure electrode portion 93 is greater than the formation area of the plane electrode portion 94.

The EBG structure electrode portion 93 is configured from three patch electrode portions 54a and three branch electrode portions 54b. The three patch electrode portions 54a are disposed in a row along the extending direction of the major side of a thin film member 91 and in an equally spaced relationship from each other.

Two ones of the three branch electrode portions 54b which are positioned on the port 52 side are provided at one end portion of the opposing region of the two patch electrode portions 54a which are adjacent each other, in the example shown in FIG. 12B, at an upper end portion of the opposing region. Meanwhile, the remaining branch electrode portion 54b is provided at one end portion of the opposing region of the EBG structure electrode portion 93 and the plane electrode portion 94. Consequently, the three patch electrode portions 54a which are adjacent each other are electrically connected to each other and the EBG structure electrode portion 93 and the plane electrode portion 94 are electrically connected to each other.

(3) Pass Characteristic

The pass characteristic of the multilayer wiring boards of the modifications 2-1 and 2-2 was determined by a simulation. It is to be noted that the multilayer wiring boards of the modifications 2-1 and 2-2 have a similar configuration of the inorganic dielectric film and the conductive film, for example, in terms of the relative dielectric constant, film thickness and size, to that of the working example described hereinabove. Also the shape and the size of the patch electrode portions 54a and the branch electrode portions 54b which configure the EBG structure electrode portion are similar to those in the working example.

Figure 13:
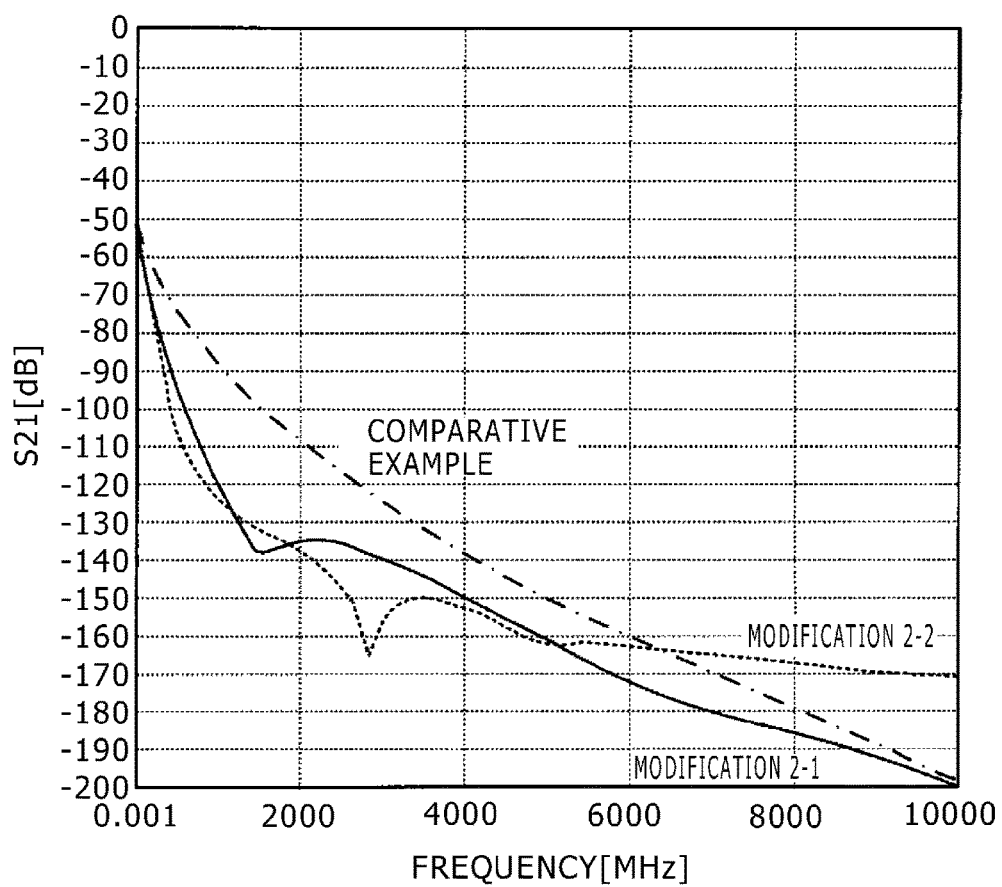
FIG. 13 is a view illustrating a pass characteristic of the multilayer wiring board fabricated by the modification 2.

FIG. 13 illustrates a result of the simulation of the pass characteristic regarding the multilayer wiring boards of the modifications 2-1 and 2-2. It is to be noted that the axis of ordinate of the characteristic indicated in FIG. 13 indicates the S parameter which represents the pass characteristic (S21) of the multilayer wiring board, and the axis of abscissa indicates the frequency. Further, a characteristic indicated by a solid line in FIG. 13 is a pass characteristic of the multilayer wiring board 80 of the modification 2-1 and another characteristic indicated by a broken line is a pass characteristic of the multilayer wiring board 90 of the modification 2-2. Further, in FIG. 13, also a pass characteristic obtained by a simulation with regard to the multilayer wiring board 60 of the comparative example described hereinabove with reference to FIG. 9, namely, a pass characteristic of an alternate long and short dash line, is shown for comparison.

As apparent from FIG. 13, it can be recognized that, in both of the modifications 2-1 and 2-2, the attenuation amount is greater and an attenuation amount of approximately −100 dB is obtained in a lower frequency band than that of the comparative example. In other words, it can be recognized that, also with the multilayer wiring board of the present example, the frequency on the low frequency side of the attenuation band, namely, the lower limit value of the attenuation band, is lower than that in the comparative example, and the attenuation band can be expanded. Particularly with the configuration of the multilayer wiring board 80 of the modification 2-1, also in a frequency region equal to or higher than approximately 6 GHz, the attenuation amount is greater than that of the comparative example. Consequently, the isolation performance between the ports can be further improved.

It is to be noted that, while, in the description of the modification 2, an example wherein the EBG structure electrode portion is configured from an AI-EBG structure is described, the present disclosure is not limited to this. Particularly, the EBG structure electrode portion may otherwise be configured from an EBG structure of the mushroom type similarly as in the modification 1.

Modification 3

A modification 3 to be described below is directed to another configuration example wherein an AI-EBG structure is provided at part of a mounting face of a multilayer wiring board for an electronic part.

Figure 14A:
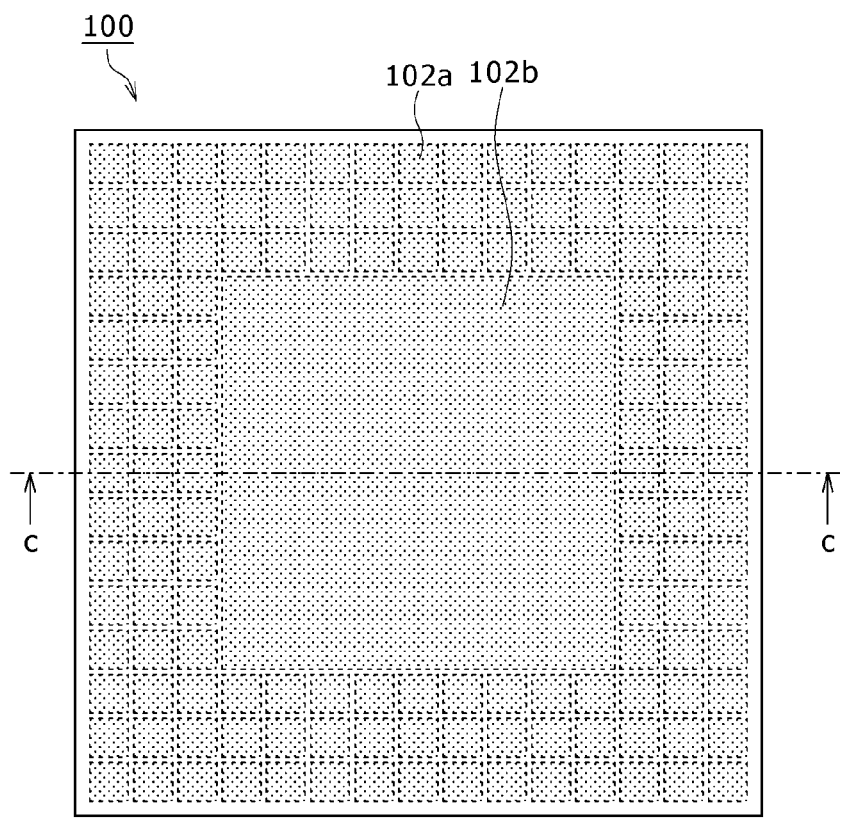
FIGS. 14A and 14B are schematic views showing a configuration of a multilayer wiring board of a modification 3.
Figure 14B:
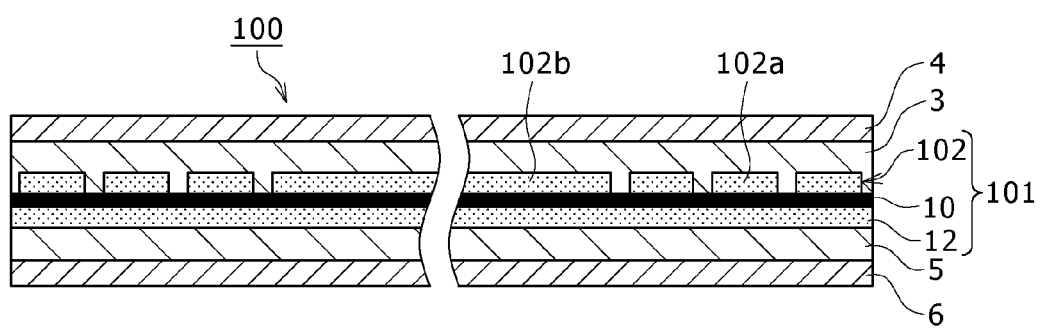

FIGS. 14A and 14B show a general configuration of a multilayer wiring board of the modification 3. It is to be noted that FIG. 14A is a top plan view of the multilayer wiring board of the modification 3, and FIG. 14B is a sectional view taken along line c-c of FIG. 14A. Further, in the multilayer wiring board 100 of the present example shown in FIGS. 14A and 14B, like elements to those of the multilayer wiring board 1 of the embodiment described hereinabove with reference to FIGS. 1A and 1B are denoted by like reference symbols. Further, in order to simplify illustration, the ports and branch electrode portions are not shown.

As apparent from comparison between FIGS. 14A and 14B and FIGS. 1A and 1B, the multilayer wiring board 100 in the present example is similar to the multilayer wiring board 1 of the embodiment except that the configuration of the thin film member is modified. Therefore, description here is given only of the configuration of a thin film member 101 while description of the configuration of the remaining part is omitted.

It is to be noted that, also in the present example, the thin film member 101 is fabricated separately from fabrication of the multilayer wiring board 100. Then, midway of a process of stacking an interlayer insulating film and a wiring film, namely, a conductive film, to fabricate the multilayer wiring board 100, the thin film member 101 itself is stacked on a film such as, for example, the interlayer insulating film to fabricate the multilayer wiring board 100. Therefore, also in the present example, the thin film member 101 is provided such that it is sandwiched or embedded in the inside of the multilayer wiring board 100 over the overall area of the mounting face of the multilayer wiring board 100 for an electronic part.

Referring to FIG. 14B, the thin film member 101 includes an inorganic dielectric film 10, a first conductive film 102 and a second conductive film 12.

In the present example, the first conductive film 102 is formed on one of faces of the inorganic dielectric film 10 while the second conductive film 12 is formed on the other face of the inorganic dielectric film 10. Further, one of the first conductive film 102 and the second conductive film 12 is connected to the power supply while the other of them is connected to the ground. It is to be noted that the inorganic dielectric film 10 is configured from an inorganic dielectric film of a high dielectric constant having a relative dielectric constant ∈r of approximately 500 to 2,000 and a film thickness of approximately 0.1 to 2 μm similarly as in the embodiment described hereinabove. Further, the second conductive film 12 is formed over the overall area of the multilayer wiring board 100.

The first conductive film 102 is configured from plurality of patch electrode portions 102a, a plurality of branch electrode portions not shown for electrically connecting adjacent ones of the patch electrode portions 102a, and a plane electrode portion 102b. It is to be noted that, in the present example, the patch electrode portions 102a are not electrically connected to the plane electrode portion 102b. Further, in the present example, each of the patch electrode portions 102a and the branch electrode portions has a square surface shape.

In the present example, an EBG structure configured from the plural patch electrode portions 102a and the plural branch electrode portions is provided at a peripheral portion of the multilayer wiring board 100 while the plane electrode portion 102b is provided at a central portion of the multilayer wiring board 100 as shown in FIG. 14A. In particular, the patch electrode portions 102a are disposed at equal intervals along the side portions of the multilayer wiring board 100. It is to be noted that, while, in the example shown in FIG. 14A, the patch electrode portions 102a are disposed in three rows or three columns along each side portion of the multilayer wiring board 100, the present disclosure is not limited to this. The number of rows or columns of the patch electrode portions 102a can be set suitably taking such conditions as, for example, a required suppression performance for electromagnetic noise, the size of the multilayer wiring board and so forth into consideration.

As described hereinabove, also in the present example, the thin film member 101 including the inorganic dielectric film 10 of a high dielectric constant and a small film thickness and having an EBG structure provided at a portion thereof is provided over the overall area of the mounting face of the multilayer wiring board 100 for an electronic part in the inside of the multilayer wiring board 100. Further, the multilayer wiring board 100 of the present example can be fabricated similarly to that of the embodiment described hereinabove. Therefore, also in the present example, advantages similar to those obtained by the embodiment can be obtained. Furthermore, in the case where an EBG structure is provided at a peripheral portion of the multilayer wiring board 100 as in the present example, noise of electromagnetic waves radiated from the peripheral portion of the multilayer wiring board 100 can be suppressed effectively.

It is to be noted that, while the modification 3 relates to an example wherein the EBG structure electrode portion is configured from an AI-EBG structure, the present disclosure is not limited to this. In particular, the EBG structure electrode portion may otherwise be configured from an EBG structure of the mushroom type similarly as in the modification 1.

Modification 4

While the multilayer wiring boards of the embodiment, working example and modifications described hereinabove can be used as a wiring board for a mother board, they may otherwise be used as an interposer board. In this instance, noise radiation propagation from semiconductor apparatus, semiconductor devices and so forth mounted on the interposer board can be suppressed.

<4. Example of the Configuration of the Electronic Apparatus (Application Example)>

The multilayer wiring boards of the embodiment, working example and modifications described above can be applied to circuit boards of various electronic apparatus. Here, such various application examples are described.

Application Example 1

An application example 1 to be described below is an example of an electronic apparatus wherein a logic circuit and an analog circuit are mounted as electronic parts on any of the multilayer wiring boards of the embodiment, working example and modifications described above.

Figure 15A:
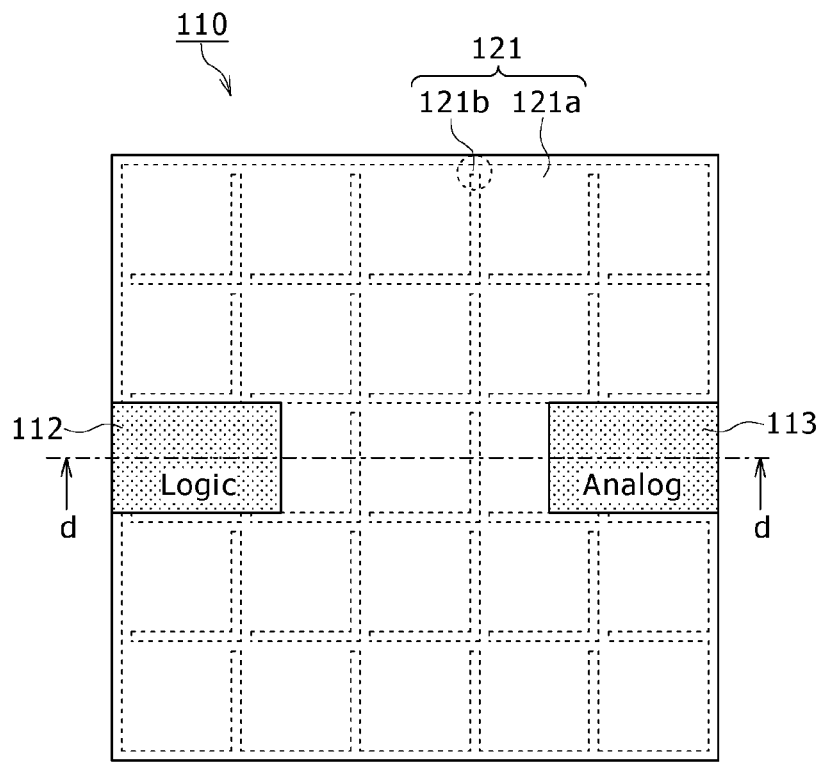
FIGS. 15A and 15B are schematic views showing a configuration of a circuit board used in an electronic apparatus of an application example 1.
Figure 15B:
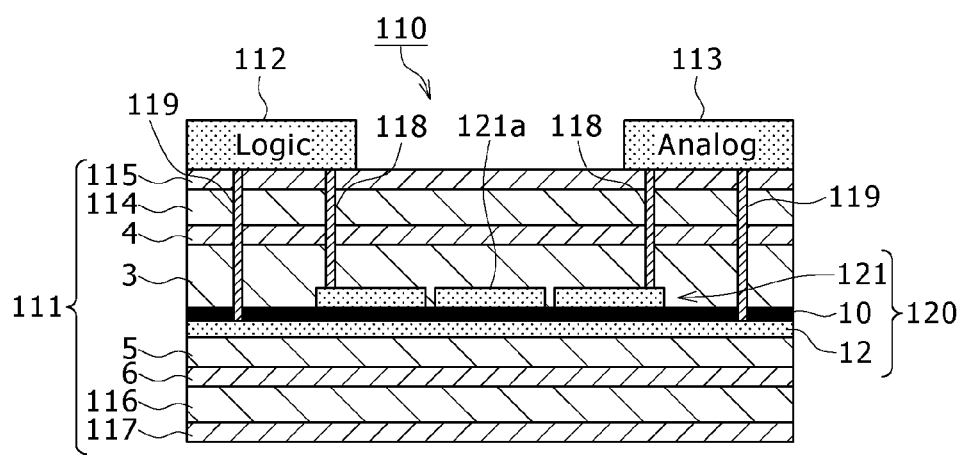

FIGS. 15A and 15B show a general configuration of a circuit board used in the electronic apparatus of the application example 1. It is to be noted that FIG. 15A is a top plan view of the circuit board in the application example 1, and FIG. 15B is a sectional view taken along line d-d of FIG. 15A. Further, in the electronic apparatus 110 of the present example shown in FIGS. 15A and 15B, like elements to those of the multilayer wiring board 1 of the embodiment described hereinabove with reference to FIGS. 1A and 1B are denoted by like reference symbols.

The electronic apparatus 110 includes a multilayer wiring board 111, a logic circuit section 112 and an analog circuit section 113.

Referring to FIG. 15B, the multilayer wiring board 111 includes a thin film member 120, a first interlayer insulating film 3, a first wiring film 4, a third interlayer insulating film 114, and a third wiring film 115. The multilayer wiring board 111 further includes a second interlayer insulating film 5, a second wiring film 6, a fourth interlayer insulating film 116 and a fourth wiring film 117. The multilayer wiring board 111 further includes first via electrode portions 118 and second via electrode portions 119.

In the present example, the first interlayer insulating film 3, first wiring film 4, third interlayer insulating film 114 and third wiring film 115 are stacked in order on one of faces of the thin film member 120, namely, on a first conductive film 121 hereinafter described. Meanwhile, on the other face of the thin film member 120, namely, on the second conductive film 12 hereinafter described, the second interlayer insulating film 5, second wiring film 6, fourth interlayer insulating film 116 and fourth wiring film 117 are stacked in order. Furthermore, in the present example, the logic circuit section 112 and the analog circuit section 113 are mounted at predetermined positions of the third wiring film 115. One of a power supply terminal and a ground terminal of each circuit section is electrically connected to the first conductive film 121 of the thin film member 120 through the first via electrode portions 118 formed so as to extend in a thickness-wise direction of the multilayer wiring board 111. Meanwhile, the other one of the power supply terminal and the ground terminal of each circuit section is electrically connected to the second conductive film 12 of the thin film member 120 through the second via electrode portions 119 formed so as to extend in the thickness-wise direction of the multilayer wiring board 111.

The thin film member 120 has an inorganic dielectric film 10, the first conductive film 121 provided on one of the faces of the inorganic dielectric film 10, and the second conductive film 12 provided on the other face of the inorganic dielectric film 10. It is to be noted that the inorganic dielectric film 10 and the second conductive film 12 can be configured similarly to those in the embodiment described hereinabove. Further, one of the first conductive film 121 and the second conductive film 12 is connected to the power supply while the other of them is connected to the ground.

Therefore, for example, if the first conductive film 121 is connected to the power supply and the second conductive film 12 is connected to the ground, then the power supply terminals of the logic circuit section 112 and the analog circuit section 113 are electrically connected to the first conductive film 121 through the first via electrode portions 118. Further, in this instance, the ground terminals of the logic circuit section 112 and the analog circuit section 113 are electrically connected to the second conductive film 12 through the second via electrode portions 119. On the contrary, if the first conductive film 121 is connected to the ground and the second conductive film 12 is connected to the power supply, the power supply terminals of the logic circuit section 112 and the analog circuit section 113 are electrically connected to the second conductive film 12 through the second via electrode portions 119. Further, in this instance, the ground terminals of the logic circuit section 112 and the analog circuit section 113 are electrically connected to the first conductive film 121 through the first via electrode portions 118.

Further, in the present example, the first conductive film 121 is configured from a plurality of patch electrode portions 121a and a plurality of branch electrode portions 121b as shown in FIG. 15A. In the example shown in FIG. 15A, 25 patch electrode portions 121a are provided on the first conductive film 121 and disposed in a matrix of 5 rows×5 columns in an equally spaced relationship from each other. It is to be noted that the patch electrode portions 121a have a square surface shape.

Further, in the example shown in FIG. 15A, two branch electrode portions 121b are provided for each of the patch electrode portions 121a. It is to be noted that each branch electrode portion 121b has a square surface shape.

One of the two branch electrode portions 121b is provided at a predetermined corner portion of the corresponding patch electrode portion 121a, in the example shown in FIG. 15A, at a right upper angle. By this one branch electrode portion 121b, two patch electrode portions 121a which are adjacent each other in the row direction are electrically connected to each other. Meanwhile, the other branch electrode portion 121b is provided at a corner portion opposing to the corner portion at which the one branch electrode portion 121b is provided in a diametrical direction of the corresponding patch electrode portion 121a, in the example shown in FIG. 15A, at the left lower corner portion. By this other branch electrode portion 121b, two patch electrode portions 121a which are adjacent each other in the column direction are electrically connected to each other. It is to be noted that, in FIG. 15B, in order to clearly indicate a connection relationship between the logic circuit section 112 and analog circuit section 113 and the first conductive film 121 and second conductive film 12, the patch electrode portions 121a positioned at the opposite end portions of the thin film member 120 on the d-d section are omitted.

Also in the electronic apparatus 110 of the application example 1 described hereinabove, the thin film member 120 having an AI-EBG structure including an inorganic dielectric film of a high dielectric constant and a small film thickness can be provided over the overall area of the mounting face for an electronic part. Therefore, with the electronic apparatus 110 of the present example, both of miniaturization of the EBG structure and expansion of the attenuation band can be anticipated.

Further, the electronic apparatus 110 of the present example is configured such that the thin film member 120 having an AI-EBG structure is provided between the logic circuit section 112 which acts as a noise generating source and the analog circuit section 113 which is influenced by noise from the logic circuit section 112. Therefore, in the present example, noise propagation between the logic circuit section 112, which is a semiconductor device which acts as a noise generating source, and the analog circuit section 113, which is a semiconductor device which is influenced by noise, can be suppressed over a wide frequency range from a low frequency band to a high frequency band. In other words, in the present example, the thin film member 120 having an AI-EBG structure acts as a filter for eliminating noise propagation.

It is to be noted that, while, in the present example, the logic circuit section 112 is taken as an example of a semiconductor device, namely, a first semiconductor circuit section, which acts as a noise generating source and the analog circuit section 113 is taken as an example of another semiconductor device, namely, a second semiconductor circuit section, which is influenced by noise of the logic circuit section 112, the present disclosure is not limited to this. The technology of the present disclosure can applied also when an arbitrary semiconductor device which acts as a noise generating source and another arbitrary semiconductor device which is influenced by noise of the former semiconductor device are mounted on a multilayer wiring board. In this instance, similar advantages can be achieved.

Application Example 2

An application example 2 to be described below is an example of an electronic apparatus wherein single-ended high speed wiring lines are mounted as electronic parts on any of the multilayer wiring boards of the embodiment, working example and modifications described above.

Figure 16:
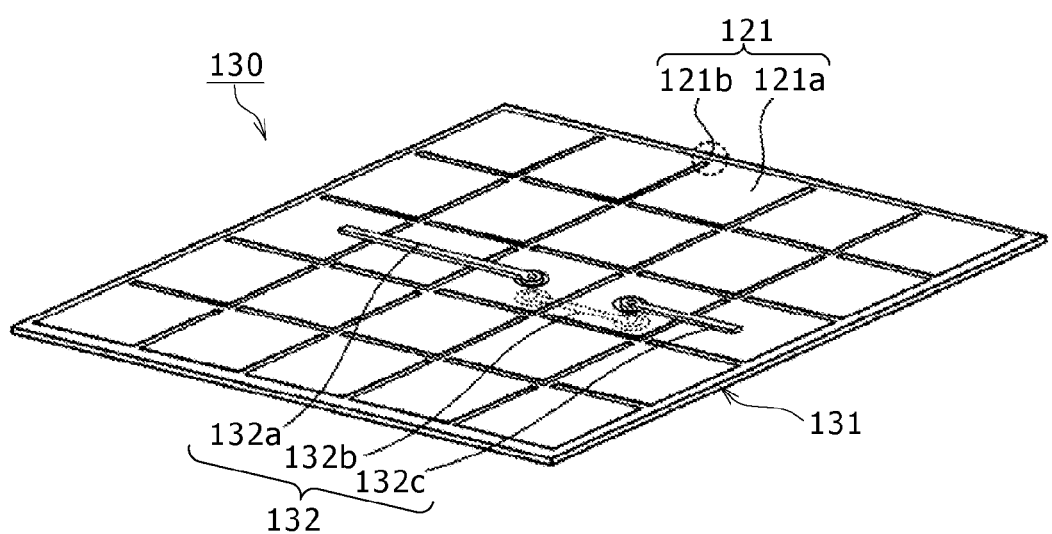
FIG. 16 is a schematic view showing a configuration of a circuit board used in an electronic apparatus of an application example 2.
Figure 17A:
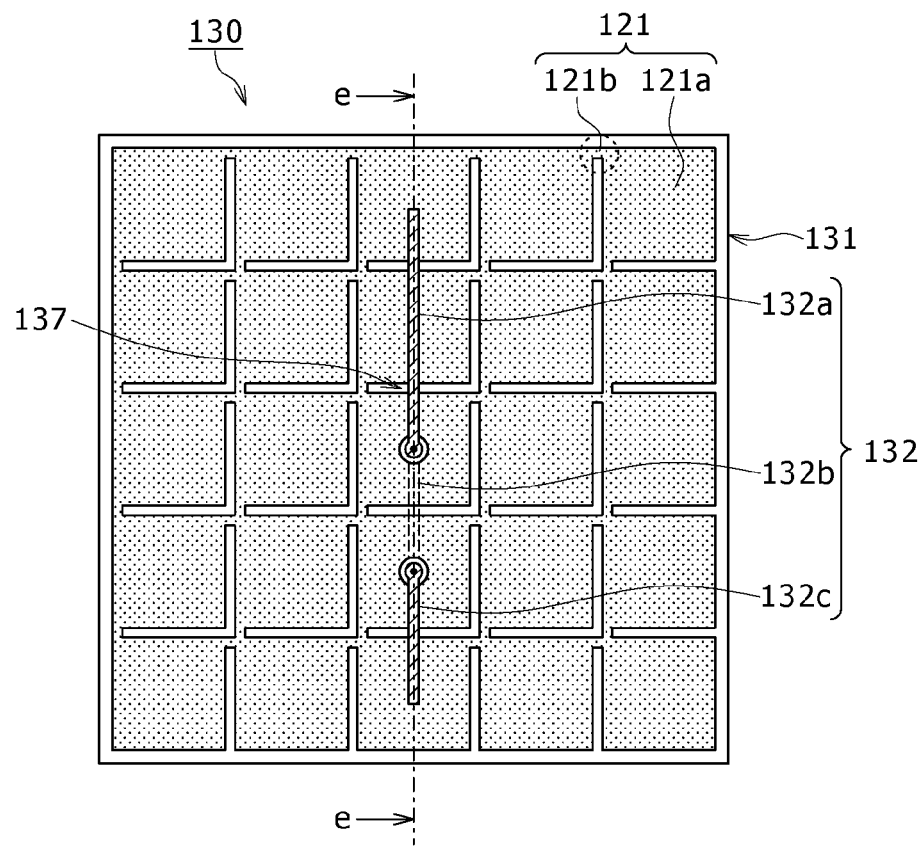
FIGS. 17A and 17B are schematic views showing a configuration of the circuit board used in the electronic apparatus of the application example 2.
Figure 17B:
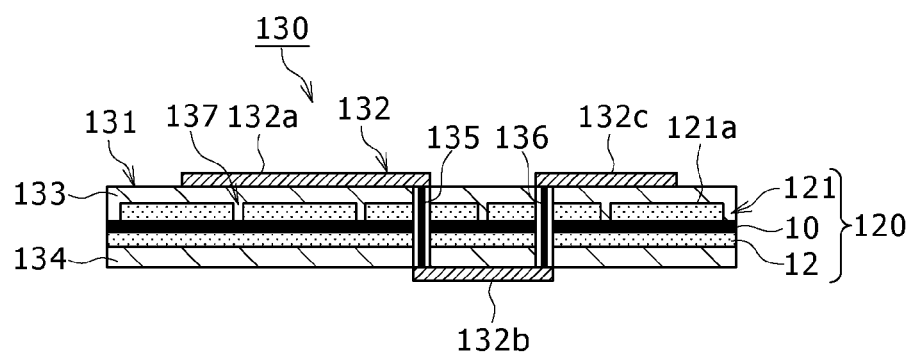

FIGS. 16, 17A and 17B show a general configuration of a circuit board used in the electronic apparatus of the application example 2. It is to be noted that FIG. 16 is a perspective view of the circuit board in the application example 2 while FIG. 17A is a top plan view of the circuit board in the application example 2 and FIG. 17B is a sectional view taken along line e-e of FIG. 17A. Further, in the electronic apparatus 130 of the present example shown in FIGS. 16, 17A and 17B, like elements to those of the electronic apparatus 110 of the application example 1 described hereinabove with reference to FIGS. 15A and 15B are denoted by like reference symbols.

The electronic apparatus 130 includes a multilayer wiring board 131 and a single-ended high-speed wiring line 132. The multilayer wiring board 131 includes a thin film member 120, and a first interlayer insulating film 133 and a second interlayer insulating film 134 provided between the thin film member 120 and the high-speed wiring line 132. It is to be noted that the thin film member 120 in the present example is similar to the thin film member used in the application example 1 described hereinabove with reference to FIGS. 15A and 15B, and therefore, description of the thin film member 120 is omitted here.

In the electronic apparatus 130 of the present example, the high-speed wiring line 132 is provided so as to extend in an extending direction of a predetermined side portion of the electronic apparatus 130, in FIG. 17A, in the upward and downward direction, in the proximity of the substantial center of the electronic apparatus 130 having a square surface shape as shown in FIGS. 16 and 17A. Further, the high-speed wiring line 132 is configured from a first high-speed wiring portion 132a, a second high-speed wiring portion 132b, and a third high-speed wiring portion 132c.

The first high-speed wiring portion 132a and the third high-speed wiring portion 132c are provided on the first conductive film 121 of the thin film member 120 with the first interlayer insulating film 133 interposed therebetween while the second high-speed wiring portion 132b is provided on the second conductive film 12 with the second interlayer insulating film 134 interposed therebetween. The second high-speed wiring portion 132b is connected at one end portion thereof to one end portion of the first high-speed wiring portion 132a through a via 135 and at the other end portion thereof to one end portion of the third high-speed wiring portion 132c through another via 136.

Also in the electronic apparatus 130 of the application example 2 described above, the thin film member 120 having an AI-EBG structure including an inorganic dielectric film of a high dielectric constant and a small film thickness can be provided over the overall area of the mounting face for an electronic part. Therefore, with the electronic apparatus 130 of the present example, both of miniaturization of the EBG structure and expansion of the attenuation band can be anticipated.

Further, in the case where the single-ended high-speed wiring line 132 is provided on the thin film member 120 or multilayer wiring board as in the case of the present example, the high-speed wiring line 132 is formed not only in a region on the patch electrode portion 121a but also in a region 137 between two adjacent ones of such patch electrode portions 121a. In this instance, the characteristic impedance for a high speed signal flowing along the high-speed wiring line 132 is discontinuous in the region 137 between the two adjacent patch electrode portions 121a, and therefore, there is the possibility that the high speed signal may be reflected by the region 137.

However, according to a validation test by the proposers of the technology of the present disclosure, it was confirmed that, with the electronic apparatus 130 of the configuration shown in FIGS. 17A and 17B, reflection of a high speed signal is suppressed sufficiently at the region 137 between two adjacent patch electrode portions 121a. In other words, it was found that, even if a single-ended high speed wiring line is mounted on any of the multilayer wiring boards of the embodiment, working example and modifications described above, the quality of a high speed signal can be maintained. It is considered that this arises from the fact that the inorganic dielectric film 10 which configures the AI-EBG structure has a sufficiently reduced film thickness.

It is to be noted that, while, in the application example 1 described hereinabove, a logic circuit section and an analog circuit section are mounted as electronic parts on a multi-layer wiring board and, in the application 2 described hereinabove, a single-ended high speed wiring line is mounted as an electronic part on a multilayer wiring board, the present disclosure is not limited to this. The technology of the present disclosure described above can be applied also to a circuit board or electronic apparatus wherein, for example, a logic circuit section, an analog circuit section and a high speed wiring line as electronic parts are mounted together. Furthermore, the technology of the present disclosure can be applied not only to the electronic parts described hereinabove in the description of the application examples 1 and 2 but also to a circuit board or electronic apparatus wherein any other electronic part is mounted together on a multilayer wiring board.

Application Example 3

An application example 3 to be described below is an example of an electronic apparatus wherein a circuit which acts as a noise generating source and a circuit which is influenced by noise generated from the former circuit are mounted on a multilayer wiring board which includes a thin film member according to the present disclosure similarly as in the case of the application example 1 described hereinabove. It is to be noted that, in the application example 3 to be described below, the multilayer wiring board is an interposer board, and not only an AI-EBG structure but also a decoupling capacitor function are provided on a thin film member.

(1) Configuration of the Electronic Apparatus and the Multilayer Wiring Board

Figure 18:
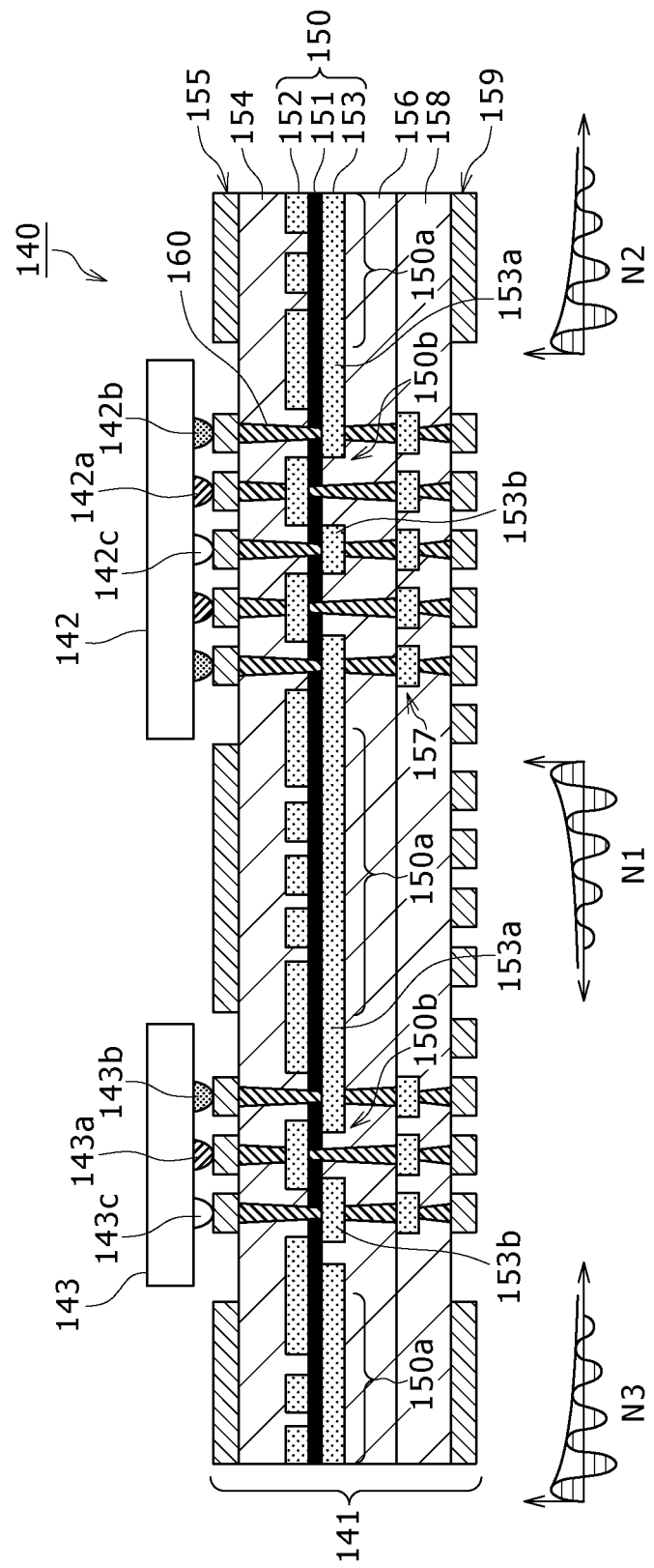
FIG. 18 is a schematic sectional view showing a configuration of a circuit board used in an electronic apparatus of an application example 3.
Figure 19:
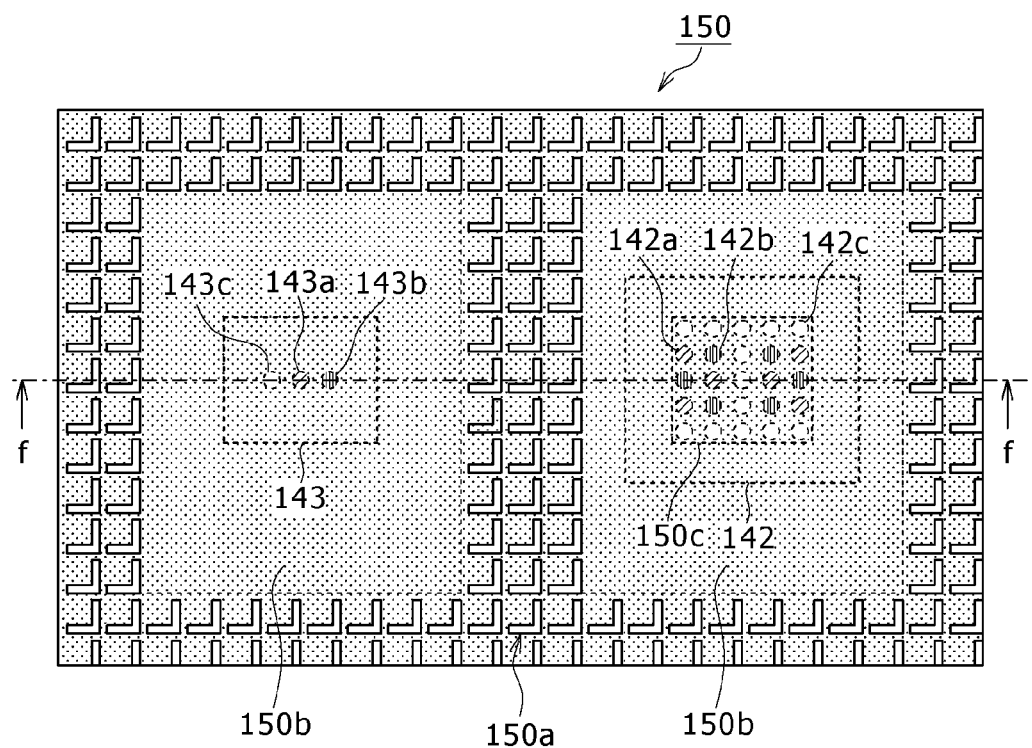
FIG. 19 is a schematic plan view showing a thin film member used in the electronic apparatus of the application example 3.

First, a general configuration of the circuit board, namely, the interposer board, used in the electronic apparatus of the application example 3 is described. FIG. 18 is a sectional view showing a general configuration of the circuit board, namely, the interposer board, used in the electronic apparatus of the application example 3. Meanwhile, FIG. 19 is a schematic top plan view of the thin film member used in the application example 3 as viewed from the first conductive film side. Also a disposition position of each circuit mounted on the thin film member of multilayer wiring board is shown in FIG. 19. It is to be noted that a sectional view taken along line f-f of FIG. 19 corresponds to FIG. 18.

Referring to FIG. 18, the electronic apparatus 140 of the application example 3 includes a multilayer wiring board or interposer board 141, and a first circuit 142, which is a first semiconductor circuit section, and a second circuit 143, which is a second semiconductor circuit section, mounted on the multilayer wiring board 141.

The multilayer wiring board 141 includes a thin film member 150, a first interlayer insulating film 154, a first wiring layer 155, a second interlayer insulating film 156, a second wiring layer 157, a third interlayer insulating film 158 and a third wiring layer 159. The multilayer wiring board 141 further includes a via electrode portion or vertical hole electrode portion 160 which electrically connects two electrode films positioned adjacent each other in a thicknesswise direction thereof. In particular, the via electrode portion 160 is provided between conductive films of the first wiring layer 155 and the thin film member 150, between conductive films of the second wiring layer 157 and the thin film member 150 and between the second wiring layer 157 and the third wiring layer 159.

In the multilayer wiring board 141 of the present example, the first interlayer insulating film 154 and the first wiring layer 155 are stacked in order on a first conductive film 152 of the thin film member 150. Further, in the present example, the second interlayer insulating film 156, second wiring layer 157, third interlayer insulating film 158 and third wiring layer 159 are stacked in order on a second conductive film 153 of the thin film member 150.

It is to be noted that the multilayer wiring board 141 of the present example is fabricated by a buildup method similarly to an ordinary organic printed wiring board. Further, in the present example, midway of a process of the buildup method, the thin film member 150 fabricated separately is stacked on the interlayer insulating film to fabricate the multilayer wiring board 141 similarly as in the embodiment described hereinabove.

The thin film member 150 includes an inorganic dielectric film 151, the first conductive film 152 provided on one of faces of the inorganic dielectric film 151, namely, on the face on the first interlayer insulating film 154 side, and the second conductive film 153 provided on the other face of the inorganic dielectric film 151. It is to be noted that, while, in the present example, the first conductive film 152 is connected to the power supply and the second conductive film 153 is connected to the ground, the present disclosure is not limited to this. In particular, the first conductive film 152 may otherwise be connected to the ground while the second conductive film 153 is connected to the power supply.

On the thin film member 150, an AI-EBG structure portion 150a and two decoupling capacitor sections 150b are provided as shown in FIG. 19. In the present example, the two decoupling capacitor sections 150b are individually provided in the mounting regions of the first circuit 142 and the second circuit 143. Particularly, the AI-EBG structure portion 150a is provided in such a manner as to surround the decoupling capacitor sections 150b. It is to be noted that the configuration of the conductive films which configure the thin film member 150 and the inorganic dielectric film 151 is hereinafter described.

The first wiring layer 155, second wiring layer 157 and third wiring layer 159 are individually formed in a predetermined wiring pattern, and a plurality of wiring electrode portions of a predetermined pattern are provided in each wiring layer. The third wiring layer 159 functions as an extraction electrode of the interposer board.

Figure 20:
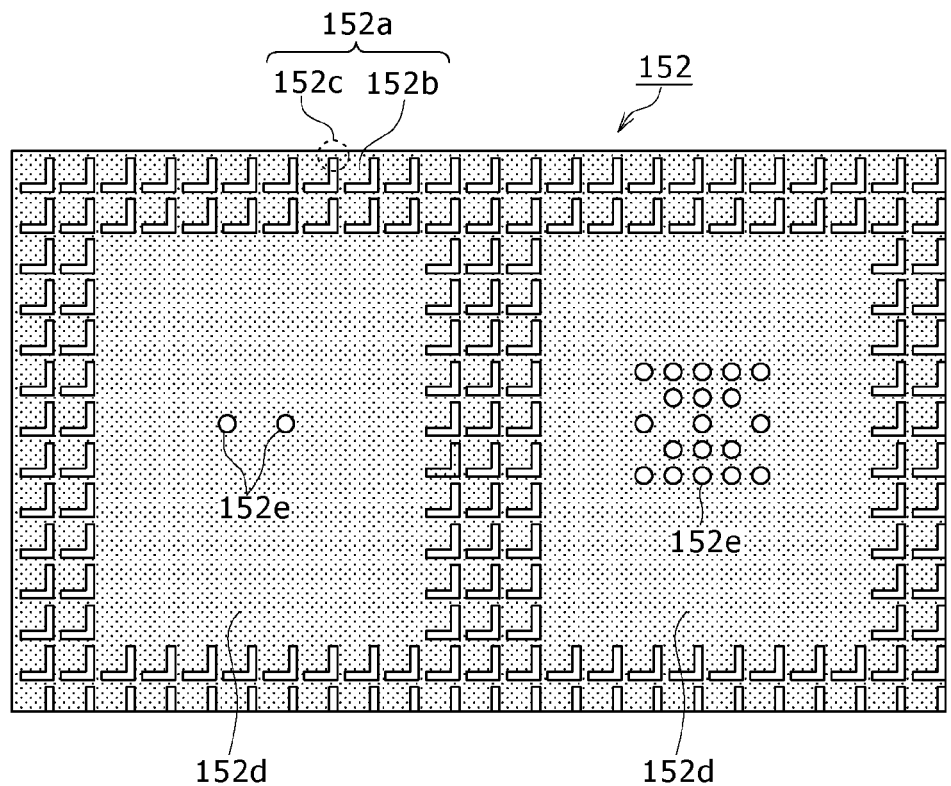
FIG. 20 is a schematic plan view of a first conductive film of the thin film member used in the electronic apparatus of the application example 3.
Figure 21:
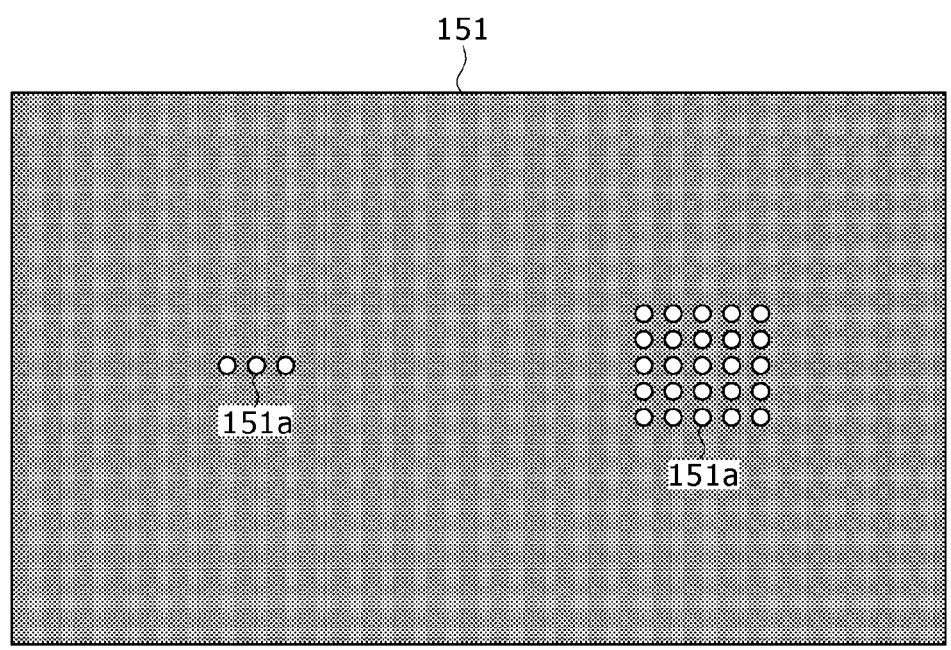
FIG. 21 is a schematic plan view of an inorganic dielectric film of the thin film member used in the electronic apparatus of the application example 3.
Figure 22:
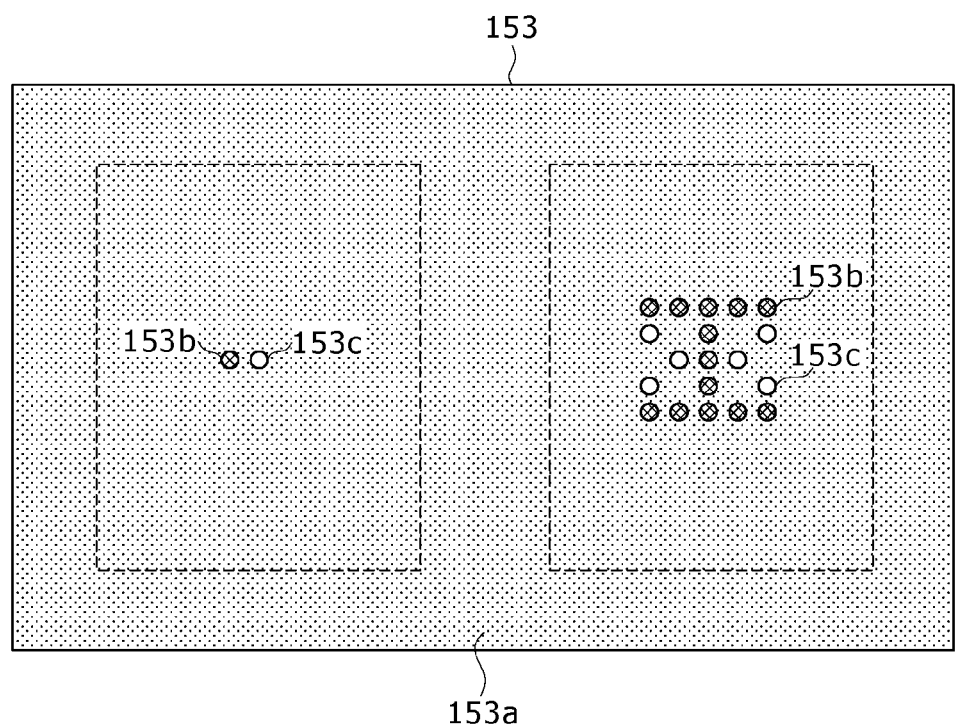
FIG. 22 is a schematic plan view of a second conductive film of the thin film member used in the electronic apparatus of the application example 3.

(2) Configuration of the First Conductive Film, Second Conductive Film and Inorganic Dielectric Film Here, a configuration of the conductive films which configure the thin film member 150 and the inorganic dielectric film 151 is described with reference to FIGS. 20 to 22. It is to be noted that FIG. 20 is a schematic plan view of the first conductive film 152; FIG. 21 is a schematic plan view of the inorganic dielectric film 151; and FIG. 22 is a schematic plan view of the second conductive film 153.

Referring to FIG. 20, the first conductive film 152 includes an EBG electrode portion 152a configured from a patch electrode portion 152b and a branch electrode portion 152c and having a predetermined pattern corresponding to an EBG structure, and two plane electrode portions 152d. The EBG electrode portion 152a is provided in a region of the thin film member 150 corresponding to the AI-EBG structure portion 150a, and the two plane electrode portions 152d are provided in regions of the thin film member 150 which correspond to the two decoupling capacitor sections 150b. In particular, the first circuit 142 is mounted or disposed in a region of one of the two plane electrode portions 152d which is, in FIG. 20, the right side plane electrode portion 152d, and the second circuit 143 is mounted in the other region which is, in FIG. 20, the left side plane electrode portion 152d.

The EBG electrode portion 152a is provided in such a manner as to surround the plane electrode portions 152d. In particular, as shown in FIG. 20, the EBG electrode portion 152a is provided in a region at an outer peripheral portion of the thin film member 150 and a region between the two plane electrode portions 152d as shown in FIG. 20. It is to be noted that, in the present example, the EBG electrode portion 152a is electrically connected to the two plane electrode portions 152d.

To each of the plane electrode portions 152d, namely, to each of electrode pattern portions which configure the decoupling capacitors, a power supply pin hereinafter described of a corresponding circuit is electrically connected. Further, in each plane electrode portion 152d, an through-hole or opening 152e is provided at each of disposition positions of a grounding pin and a function pin hereinafter described of a corresponding circuit. Since a corresponding via electrode portion 160 is disposed in each of the through-holes 152e, in order to maintain an electric non-contacting state between the via electrode portion 160 and the first conductive film 152, the diameter of the through-hole 152e is set to a value greater than the diameter of the via electrode portion 160.

Referring now to FIG. 21, the inorganic dielectric film 151 has a plurality of through-holes or openings 151a. The through-holes 151a are provided at disposition positions of a power supply pin, a ground pin and a function pin hereinafter described of each circuit mounted on the multilayer wiring board 141. Further, since, in each of the through-holes 151a, a corresponding via electrode portion 160 is disposed, the diameter of each through-hole 151a is set to a value equal to or greater than the diameter of the via electrode portion 160. It is to be noted that the inorganic dielectric film 151 of the present example is configured similarly to the inorganic dielectric film 10 of the embodiment described above except that the through-holes 151a are provided in the disposition regions of the multilayer wiring board 141 in which the circuits mounted on the multilayer wiring board 141 are disposed.

Referring to FIG. 22, the second conductive film 153 is configured from an electrode film in a substantially plane form and has an electrode portion 153a and a plurality of pad portions 153b. A ground pin hereinafter described of each circuit mounted on the multilayer wiring board 141 is electrically connected to the electrode portion 153a. Further, at a disposition position on the electrode portion 153a of a power supply pin hereinafter described of each circuit mounted on the multilayer wiring board 141, a through-hole or opening 153c is provided. Further, each of the pad portions 153b is provided at a disposition position of a function pin hereinafter described of a circuit mounted on the multilayer wiring board 141.

In particular, in a region of the second conductive film 153 opposing to the formation region of the plane electrode portion 152d of the first conductive film 152, namely, in the region surrounded by a broken line in FIG. 22, a plurality of pad portions 153b and a plurality of through-holes 153c are formed. It is to be noted that, since a corresponding via electrode portion 160 is disposed in each of the through-holes 153c, in order to maintain an electric non-contacting state between the via electrode portion 160 and the second conductive film 153, the diameter of each through-hole 153c is set to a value greater than the diameter of the via electrode portion 160.

Figure 23:
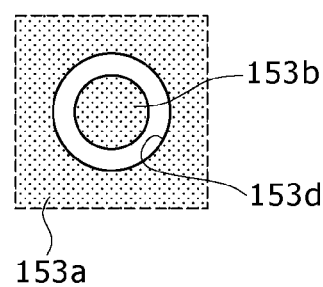
FIG. 23 is an enlarged plan view of a pad portion of the second conductive film of the thin film member used in the electronic apparatus of the application example 3.

FIG. 23 shows an enlarged top plan view of a pad portion 153b. Referring to FIG. 23, the pad portion 153b is configured from a conductive film formed from a material same as that of the second conductive film 153. The pad portion 153b is provided in a through-hole or opening 153d formed at a disposition position of a function pin in the electrode portion 153a such that it does not contact with the electrode portion 153a.

It is to be noted that, while, in the example described above, a through-hole is formed in a region in the first conductive film 152 corresponding to the disposition position of a function pin and besides a pad portion is provided in a region in the second conductive film 153 corresponding to the disposition position of a function pin, the present disclosure is not limited to this. For example, a pad portion may be provided in a region in the first conductive film 152 corresponding to the disposition position of a function pin while a through-hole is provided in a region in the second conductive film 153 corresponding to the disposition position of a function pin. Or, for example, a through-hole may be provided in a region corresponding to the disposition position of each function pin in both of the first conductive film 152 and the second conductive film 153.

As described above, in the electronic apparatus 140 of the present example, a power supply pin of each circuit mounted on the multilayer wiring board 141 is connected to the power supply through the first conductive film 152 while a ground pin of each circuit is connected to the ground through the second conductive film 153. Therefore, in a region of the thin film member 150 in which a power supply pin and a ground pin are connected, namely, a region immediately below the circuit, which is a low-capacitance capacitor portion 150c in FIG. 19, a capacitor of a very low capacitance is formed between the first conductive film 152 and the second conductive film 153. This capacitor functions as a decoupling capacitor of a high frequency band.

Further, in the present example, since each plane electrode portion 152d is formed in a dimension sufficiently greater than the dimension between the power supply pin and the ground pin, in the entire formation region of the plane electrode portions 152d, a capacitor of a high capacitance is formed between the first conductive film 152 and the second conductive film 153. Therefore, the capacitor formed over the overall area of the formation region of the plane electrode portions 152d functions as a decoupling capacitor of a low frequency band.

It is to be noted that, while, in the example described above, the area of the formation region of the plane electrode portion 152d, namely, of the decoupling capacitor sections 150b, is greater than the area of the circuit mounted in the region, the present disclosure is not limited to this. In particular, the area of the formation region of the plane electrode portion 152d, namely, the decoupling capacitor sections 150b, may be equal to or smaller than the area of the circuit mounted in the region. Further, the plane electrode portion 152d, namely, the decoupling capacitor sections 150b, may be provided only in the proximity of the connection regions of the power supply pin and the ground pin.

(3) Configuration and Wiring Scheme of the First and Second Circuits

Now, a configuration of the first circuit 142 and the second circuit 143 and an electric connection scheme, namely, a wiring scheme, between the first and second circuits 142 and 143 and the multilayer wiring board 141 are described with reference to FIGS. 18 and 19.

The first circuit 142 is a circuit which acts as a noise generating source such as, for example, a digital circuit in the form of an LSI (Large-Scale Integration) while the second circuit 143 is a circuit which is influenced by noise generated from the first circuit 142 such as, for example, a high frequency analog circuit in the form of an LSI. Further, the first circuit 142 and the second circuit 143 are mounted in regions of the first conductive film 152 of the thin film member 150 in which corresponding decoupling capacitor sections 150b are formed.

The first circuit 142 includes a plurality of power supply pins 142a, a plurality of ground pins 142b and a plurality of function pins 142c such as, for example, I/O (Input/Output) pins. In the present example, as seen in FIG. 19, six power supply pins 142*a*, six ground pins 142*b* and 13 function pins 142*c*, and hence totaling 25 pins, are provided and arrayed in a predetermined pattern of a 5×5 matrix. For example, on a line of a section f-f indicated by an alternate long and short dash line in FIG. 19, a ground pin 142*b*, a power supply pin 142*a*, a function pin 142*c*, another ground pin 142*b* and another power supply pin 142*a* are disposed in order in a row in an equally spaced relationship from each other from the second circuit 143 side. It is to be noted that the number and disposition configuration of the pins of the first circuit 142 are not limited to them but can be set arbitrarily.

Each power supply pin 142*a* of the first circuit 142 is connected to a predetermined wiring electrode portion of the first wiring layer 155 as shown in FIG. 18, and the wiring electrode portion is connected to the first conductive film 152 of the thin film member 150 through the via electrode portion 160 which extends through the first interlayer insulating film 154. Further, the first conductive film 152 of the thin film member 150 is connected to a predetermined wiring electrode portion of the second wiring layer 157 through the via electrode portion 160 which extends through the inorganic dielectric film 151 and the second interlayer insulating film 156.

It is to be noted that the via electrode portion 160 which connects the first conductive film 152 and the second wiring layer 157 to each other is disposed in the through-hole 153*c* of the second conductive film 153 so that it does not contact with the second conductive film 153. Consequently, an electric non-contacting state between the power supply pin 142*a* of the first circuit 142 and the second conductive film 153 of the thin film member 150 is maintained.

The predetermined wiring electrode portion of the second wiring layer 157 connected to the first conductive film 152 through the via electrode portion 160 is connected to a predetermined wiring electrode portion of the third wiring layer 159 through the via electrode portion 160 which extends through the third interlayer insulating film 158. As a result, the power supply pin 142*a* of the first circuit 142 is electrically connected to a wiring electrode portion corresponding to the third wiring layer 159, namely, a power supply extraction electrode portion of the interposer board.

The ground pin 142*b* of the first circuit 142 is connected to a predetermined wiring electrode portion of the first wiring layer 155 as shown in FIG. 18. Then, the wiring electrode portion of the first wiring layer 155 is connected to the electrode portion 153*a* of the second conductive film 153 of the thin film member 150 through the via electrode portion 160 which extends through the first interlayer insulating film 154 and the inorganic dielectric film 151.

It is to be noted that the via electrode portion 160 which connects the first wiring layer 155 and the electrode portion 153*a* of the second conductive film 153 to each other is disposed in the through-hole 152*e* of the first conductive film 152 so that it does not contact with the first conductive film 152. Consequently, an electric non-contacting state between the ground pin 142*b* of the first circuit 142 and the first conductive film 152 of the thin film member 150 is maintained.

Meanwhile, the electrode portion 153*a* of the second conductive film 153 is connected to a predetermined wiring electrode portion of the second wiring layer 157 through the via electrode portion 160 which extends through the second interlayer insulating film 156. The wiring electrode portion of the second wiring layer 157 is connected to a predetermined wiring electrode portion of the third wiring layer 159 through the via electrode portion 160 which extends through the third interlayer insulating film 158. As a result, the ground pin 142*b* of the first circuit 142 is electrically connected to the corresponding wiring electrode portion of the third wiring layer 159, namely, to the ground extraction electrode portion of the interposer board.

Further, the function pin 142*c* of the first circuit 142 is connected to a predetermined wiring electrode portion of the first wiring layer 155 as shown in FIG. 18. Then, the wiring electrode portion of the first wiring layer 155 is connected to the pad portion 153*b* of the second conductive film 153 of the thin film member 150 through the via electrode portion 160 which extends through the first interlayer insulating film 154 and the inorganic dielectric film 151.

It is to be noted that the via electrode portion 160 which connects the first wiring layer 155 and the pad portion 153*b* of the second conductive film 153 to each other is disposed in the through-hole 152*e* of the first conductive film 152 so that it does not contact with the first conductive film 152. Consequently, an electric non-contacting state between the function pin 142*c* of the first circuit 142 and the first conductive film 152, which is a power supply wiring line, and second conductive film 153, which is a ground wiring line, is maintained.

The pad portion 153*b* of the second conductive film 153 is connected to a predetermined wiring electrode portion of the second wiring layer 157 through the via electrode portion 160 which extends through the second interlayer insulating film 156. Then, the wiring electrode portion of the second wiring layer 157 is connected to a predetermined wiring electrode of the third wiring layer 159 through the via electrode portion 160 which extends through the third interlayer insulating film 158. As a result, the function pin 142*c* of the first circuit 142 is electrically connected to a corresponding wiring electrode portion of the third wiring layer 159, namely, the signal extraction electrode portion of the interposer board.

Meanwhile, the second circuit 143 has a power supply pin 143*a*, a ground pin 143*b* and a function pin 143*c*. In the present example, the second circuit 143 has a single power supply pin 143*a*, a single ground pin 143*b* and a single function pin 143*c*, which are disposed along an opposing direction of the first circuit 142 and the second circuit 143, namely, in a direction of a cross section taken along line f-f of FIG. 19 indicated by an alternate long and short dash line as shown in FIG. 19. More particularly, the ground pin 143*b*, power supply pin 143*a* and function pin 143*c* are disposed in order in a row in an equally spaced relationship from each other from the first circuit 142 side in the opposing direction of the first circuit 142 and the second circuit 143. It is to be noted that the number and the disposition configuration of the pins of the second circuit 143 are not limited to those but can be set arbitrarily.

Further, the connection scheme, namely, the wiring scheme, between the power supply pin 143*a*, ground pin 143*b* and function pin 143*c* of the second circuit 143 and corresponding wiring electrode portions of the third wiring layer 159, namely, extraction electrode portions of the interposer board, is similar to that of the first circuit 142 described hereinabove.

Also in the electronic apparatus 140 of the application example 3 described above, the thin film member 150 which includes an AI-EBG structure including an inorganic dielectric film of a high dielectric constant and a small film thickness can be provided over the overall area of the mounting face for an electronic part. Therefore, also with the electronic apparatus 140 of the present example, both of miniaturization of the EBG structure and expansion of the attenuation band can be anticipated.

Further, in the electronic apparatus 140 of the present example, an EBG structure is provided between the first circuit 142 which acts as a noise generating source and the second circuit 143 which is influenced by noise from the first circuit 142. Therefore, propagation of noise emitted from the first circuit 142 to the second circuit 143, namely, noise N1 in FIG. 18, can be suppressed over a wide range from a low frequency band to a high frequency band. Furthermore, in the present example, an EBG structure is provided in a region of an outer peripheral portion of the multilayer wiring board 141. Therefore, propagation or electromagnetic radiation of noise radiated from the first circuit 142 to the outside, namely, noise N2 in FIG. 18, can be suppressed, and also propagation of external noise to enter the second circuit 143 from the outside, namely, noise N3 in FIG. 18, can be suppressed.

Further, in the electronic apparatus 140 of the present example, since the decoupling capacitor section 150b is provided in a mounting region of the multilayer wiring board 141 for a circuit, power supply stability of the circuits can be anticipated. Further, since a capacitor of a comparatively high capacitance is formed on the decoupling capacitor section 150b as described hereinabove, it acts also as a noise filter for suppressing noise components in a low frequency band from noise generated from the first circuit 142. Therefore, with the configuration of the thin film member 150 of the present example, noise in a low frequency band can be suppressed further.

Application Example 4

An application example 4 to be described below is an example of an electronic apparatus wherein a circuit which acts as a noise generating source and another circuit which is influenced by noise generated from the former circuit are mounted on a multilayer wiring board which includes the thin film member according to the present disclosure. It is to be noted that, in the application example 4, the multilayer wiring board is a mother board, and not only an AI-EBG function but also a decoupling capacitor function are provided on the thin film member.

(1) Configuration of the Electronic Apparatus

Figure 24:
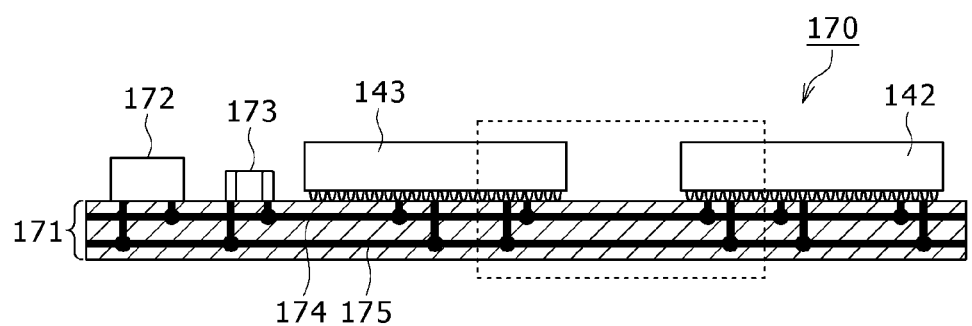
FIG. 24 is a schematic sectional view showing a configuration of a circuit board used in an electronic apparatus of an application example 4.

First, a general configuration of the electronic apparatus of the application example 4 is described with reference to FIG. 24. FIG. 24 is a sectional view showing a general configuration of a circuit board, namely, a mother board, used in the electronic apparatus of the application example 4. It is to be noted that, in the electronic apparatus 170 of the present example shown in FIG. 24, like elements to those of the electronic apparatus 140 of the application example 3 shown in FIG. 18 are denoted by like reference symbols.

The electronic apparatus 170 of the application example 4 includes a multilayer wiring board 171 which is a mother board, and a first circuit 142, namely, a first semiconductor circuit section, a second circuit 143, namely, a second semiconductor circuit section, a DC/DC (direct current to direct current) converter 172 and a bulk C circuit 173 all mounted on the multilayer wiring board 171. The circuits mentioned are connected to a power supply line 174 and a ground line 175 provided in the multilayer wiring board 171. It is to be noted that, in FIG. 24, a thin film member which has an EBG structure included in the multilayer wiring board 171 is omitted for simplified illustration.

It is to be noted that the bulk C circuit 173 is provided in order to stabilize power supply when the DC/DC converter 172 supplies power to the circuits on the multilayer wiring board 171. Particularly, the bulk C circuit 173 is provided in order to stabilize the power supply in a low frequency band. It is to be noted that, in the present example, the stabilization action of the power supply in a high frequency band can be obtained by the decoupling capacitor section provided in the thin film member. However, the present disclosure is not limited to this, but the decoupling capacitor circuit for obtaining the stabilization action of the power supply in a high frequency band can be provided separately on the multilayer wiring board 171.

(2) Configuration of the Multilayer Wiring Board

Figure 25:
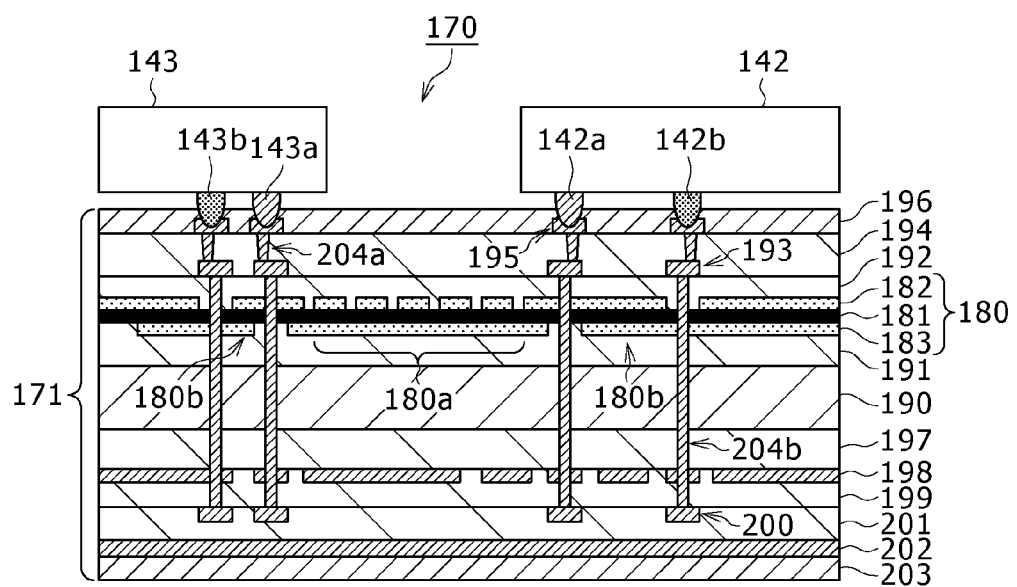
FIG. 25 is an enlarged sectional view showing a configuration of the circuit board used in the electronic apparatus of the application example 4.

Now, the configuration of the multilayer wiring board 171 is described in more detail with reference to FIG. 25. FIG. 25 is an enlarged sectional view of a region surrounded by a broken line in FIG. 24.

Further, in FIG. 25, only power supply pins and ground pins of the circuits and a connection scheme between the pins and the electrode films in the multilayer wiring board 171 are shown for simplified illustration. Therefore, in FIG. 25, the function pins of the circuits and a connection scheme between the function pins and the electrode films in the multilayer wiring board 171 are omitted. It is to be noted that the connection scheme between the function pins of the circuits and the electrode films in the multilayer wiring board 171 in the present example can be configured similarly to that of the application example 3 described hereinabove.

The multilayer wiring board 171 includes a thin film member 180, a core layer 190, a first interlayer insulating film 191, a second interlayer insulating film 192, a first wiring layer 193, a third interlayer insulating film 194, a second wiring layer 195, and a first solder resist layer 196. The multilayer wiring board 171 further includes a fourth interlayer insulating film 197, a third wiring layer 198, a fifth interlayer insulating film 199, a fourth wiring layer 200, a sixth interlayer insulating film 201, a fifth wiring layer 202 and a second solder resist layer 203. The multilayer wiring board 171 further includes via electrode portions or vertical hole electrode portions 204a and 204b which electrically connect two electrode films positioned adjacent each other in the thickness-wise direction.

In the multilayer wiring board 171 of the present example, the first interlayer insulating film 191, thin film member 180, second interlayer insulating film 192, first wiring layer 193, third interlayer insulating film 194, second wiring layer 195 and first solder resist layer 196 are stacked in order on one of faces of the core layer 190. Further, in the multilayer wiring board 171, the fourth interlayer insulating film 197, third wiring layer 198, fifth interlayer insulating film 199, fourth wiring layer 200, sixth interlayer insulating film 201, fifth wiring layer 202 and second solder resist layer 203 are stacked in order on the other face of the core layer 190.

It is to be noted that the multilayer wiring board 171 of the present example is fabricated by a buildup method similarly to ordinary organic printed wiring boards. Further, in the present example, midway of a process of the buildup method, the thin film member 180 fabricated separately is stacked on the first interlayer insulating film 191 to fabricate the multilayer wiring board 171.

The thin film member 180 has an inorganic dielectric film 181, a first conductive film 182 provided on one of faces of the inorganic dielectric film 181 which is on the second interlayer insulating film 192 side, and a second conductive film 183 provided on the other face of the inorganic dielectric film 181. The configuration of the thin film member 180 of the present example is similar to that of the thin film member 150 of the application example 3 described hereinabove, and therefore, description of the configuration of the thin film member 180 is omitted here.

It is to be noted that, in the present example, a decoupling capacitor section 180*b* is provided in a region of the thin film member 180 corresponding to mounting regions for the circuits similarly as in the application example 3. Further, in the present example, an AI-EBG structure portion 180*a* is provided around the decoupling capacitor section 180*b* of the thin film member 180 and in a region at an outer peripheral end portion of the multilayer wiring board 171 similarly as in the application example 3 described hereinabove. Furthermore, in the present example, the first conductive film 182 is connected to the power supply while the second conductive film 183 is connected to the ground. However, the present disclosure is not limited to this, but the first conductive film 182 may otherwise be connected to the ground while the second conductive film 183 is connected to the power supply.

Further, in the present example, each of the first wiring layer 193, second wiring layer 195, third wiring layer 198 and fourth wiring layer 200 is formed in a predetermined wiring pattern, and a plurality of wiring electrode portions of predetermined patterns are provided in each wiring layer. Further, the fifth wiring layer 202 is configured from a conductive film in the form of a plane formed over the overall area of the multilayer wiring board 171.

(3) Configuration and Wiring Scheme of the First and Second Circuits

Now, an electric connection scheme or wiring scheme between the multilayer wiring board 171 and the first circuit 142 and second circuit 143 is described with reference to FIG. 25. It is to be noted that the first circuit 142 is a circuit or LSI such as, for example, a digital circuit which acts as a generating source of noise and the second circuit 143 is another circuit or LSI such as, for example, a high frequency analog circuit which is influenced by noise generated from the first circuit 142 similarly as in the application example 3 described hereinabove. Further, the circuits mentioned are mounted in a region of the decoupling capacitor section 180*b* of the thin film member 180 as shown in FIG. 25.

A power supply pin 142*a* of the first circuit 142 is connected to a predetermined wiring electrode portion of the second wiring layer 195 as shown in FIG. 25, and the wiring electrode portion is connected to a predetermined wiring electrode portion of the first wiring layer 193 through a via electrode portion 204*a* which extends through the third interlayer insulating film 194. Further, the wiring electrode portion of the first wiring layer 193 is connected to the first conductive film 182 through a via electrode portion 204*b* which extends through the second interlayer insulating film 192. It is to be noted that the via electrode portion 204*b* is provided such that it extends through the second interlayer insulating film 192, thin film member 180, first interlayer insulating film 191, core layer 190, fourth interlayer insulating film 197, third wiring layer 198 and fifth interlayer insulating film 199 as shown in FIG. 25. Therefore, the first conductive film 182 of the thin film member 180 is connected to a predetermined wiring electrode portion of the third wiring layer 198 and a predetermined wiring electrode portion of the fourth wiring layer 200 through the via electrode portion 204*b*.

It is to be noted that the via electrode portion 204*b* which connects the first conductive film 182 and the fourth wiring layer 200 to each other is disposed in a through-hole of the second conductive film 183 so that it does not contact with the second conductive film 183. Consequently, an electric non-contacting state between the power supply pin 142*a* of the first circuit 142 and the second conductive film 183 of the thin film member 180 is maintained.

Meanwhile, a ground pin 142*b* of the first circuit 142 is connected to a predetermined wiring electrode portion of the second wiring layer 195 as shown in FIG. 25, and the wiring electrode portion is connected to a predetermined wiring electrode portion of the first wiring layer 193 through the via electrode portion 204*a* which extends through the third interlayer insulating film 194. Further, the wiring electrode portion of the first wiring layer 193 is connected to the second conductive film 183, which is an electrode portion not shown other than the pad portion, through the via electrode portion 204*b*.

It is to be noted that the via electrode portion 204*b* which connects the first wiring layer 193 and the second conductive film 183 to each other is disposed in a through-hole of the first conductive film 182 so that it does not contact with the first conductive film 182. Consequently, an electric non-contacting state between the ground pin 142*b* of the first circuit 142 and the first conductive film 182 of the thin film member 180 is maintained.

Further, the second conductive film 183, which is an electrode portion not shown other than the pad portion, is connected to a predetermined wiring electrode portion of the third wiring layer 198 and a predetermined wiring electrode portion of the fourth wiring layer 200 through the via electrode portion 204*b*.

Further, a power supply pin 143*a* and a ground pin 143*b* of the second circuit 143 are connected to various wiring layers through the via electrode portions 204*a* and 204*b* as shown in FIG. 25 similarly to the power supply pin 142*a* and the ground pin 142*b* of the first circuit 142.

Also in the electronic apparatus 170 of the application example 4 described above, the thin film member 180 having an AI-EBG structure including an inorganic dielectric film of a high dielectric constant and a small film thickness can be provided over the overall area of the mounting face for an electronic part. Therefore, also with the electronic apparatus 170 of the present example, both of miniaturization of the EBG structure and expansion of the attenuation band can be anticipated.

Further, in the electronic apparatus 170 of the present example, the thin film member 180 which has not only an AI-EBG function but also a decoupling capacitor function is provided in the multilayer wiring board 171. Therefore, also in the present example, effects similar to those of the application example 3 described hereinabove can be achieved.

It is to be noted that, while, in the application examples 3 and 4 described hereinabove, the first circuit 142 which acts as a noise generating source and is a digital circuit section and the second circuit 143 which is influenced by noise from the first circuit 142 and is an analog circuit section are provided in separate circuit chips from each other, the present disclosure is not limited to this. For example, the present disclosure can be applied also in the case where a circuit chip which includes both of a digital circuit section and an analog circuit section is mounted. In this instance, a decoupling capacitor section may be provided in a region of a thin film member which corresponds to each of a formation region of the digital circuit section and a formation region of the analog circuit section in the circuit chip.

Further, while, in the application examples 3 and 4 described hereinabove, a decoupling capacitor section is provided in both of mounting regions for a circuit section which acts as a noise generating circuit and another circuit section which is influenced by the noise generating circuit, the present disclosure is not limited to this. The decoupling capacitor section may be provided in a mounting region of at least one of the circuit sections.

The present disclosure may assume such configurations as described below.

(1) A wiring board, including a thin film member configured to include an inorganic dielectric film formed over an overall area of a mounting face thereof for an electronic part, a first conductive film formed over an overall area of one of faces of the inorganic dielectric film and including a plurality of patch electrode portions disposed in a predetermined pattern corresponding to a predetermined electromagnetic band gap structure in at least part of the area, and a second conductive film formed over an overall area of the other face of the inorganic dielectric film.

(2) The wiring board according to (1), wherein the first conductive film has the plurality of patch electrode portions and a branch electrode portion configured to electrically connect each two adjacent ones of the patch electrode portions to each other.

(3) The wiring board according to (1) or (2), wherein the electromagnetic band gap structure is formed over the overall area of the mounting face for an electronic part.

(4) The wiring board according to (1) or (2), wherein the first conductive film includes the plurality of patch electrode portions formed in part of the area of the mounting face for an electronic part, and a plane electrode portion formed in the remaining area of the mounting face for an electronic part.

(5) The wiring board according to (1) or (2), wherein the first conductive film has an electrode pattern portion formed in a predetermined region of the first conductive film and configuring a decoupling capacitor, and the electrode pattern portion is electrically connected to the patch electrode portion.

(6) The wiring board according to (4) or (5), wherein the plurality of patch electrode portions are disposed along a peripheral side end portion of the thin film member.

(7) The wiring board according to any one of (1) to (6), wherein the inorganic dielectric film is formed from a material selected from a group of barium titanate, barium strontium titanate, strontium titanate and lead zirconate titanate.

(8) The wiring board according to any one of (1) to (7), wherein one of the first conductive film and the second conductive film is connected to a power supply, and the other of the first and second conductive films is connected to the ground.

(9) The wiring board according to any one of (1) to (8), further including:

a via electrode portion configured to be provided for each of the patch electrode portions; and a plane electrode film provided on the via electrode portion and formed over the overall area of the mounting face for an electronic part, wherein the via electrode portion is connected at one end thereof to a corresponding one of the patch electrode portions and at the other end thereof to the plane electrode film.

(10) The wiring board according to any one of (1) to (9), wherein the wiring board is an interposer board.

(11) An electronic apparatus, including:

a wiring board including a thin film member which includes an inorganic dielectric film formed over an overall area of a mounting face thereof for an electronic part, a first conductive film formed over an overall area of one of faces of the inorganic dielectric film and including a plurality of patch electrode portions disposed in a predetermined pattern corresponding to a predetermined electromagnetic band gap structure in at least part of the area, and a second conductive film formed over an overall area of the other face of the inorganic dielectric film; and an electronic part mounted on the wiring board.

(12) The electronic apparatus according to (11), wherein the electronic part includes a first semiconductor circuit section which acts as a generating source of noise, and a second semiconductor circuit section which is influenced by the noise, and the first semiconductor circuit section and the second semiconductor circuit section are connected to a power supply through one of the first conductive film and the second conductive film and are connected to the ground through the other one of the first conductive film and the second conductive film.

(13) The electronic apparatus according to (12), wherein the first conductive film has an electrode pattern portion formed at part of a predetermined region corresponding to a mounting region for at least one of the first semiconductor circuit section and the second semiconductor circuit section so as to configure a decoupling capacitor, and the electrode pattern portion is electrically connected to the patch electrode portions.

(14) The electronic apparatus according to (12) or (13), wherein the first semiconductor circuit section is a digital circuit section while the second semiconductor circuit section is an analog circuit section.

(15) The electronic apparatus according to any one of (11) to (14), wherein the electronic part includes a single-ended high speed wiring line, part of which is provided in a formation area of the plurality of patch electrode portions.

The present disclosure contains subject matter related to that disclosed in Japanese Priority Patent Application JP 2012-156614 and JP 2012-086072 filed in the Japan Patent Office on Jul. 12, 2012 and Apr. 5, 2012, respectively, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A wiring board, comprising:
first and second wiring layers;
first and second interlayer insulating layers between the first and second wiring layers; and
a thin film member between the first and second wiring layers, the thin film member including (a) an inorganic dielectric film extending all over an area of a mounting face thereof for an electronic part, (b) a first conductive film directly on and extending all over a first face of the inorganic dielectric film and configured of a plurality of patch electrode portions disposed in a predetermined pattern corresponding to a predetermined electromagnetic band gap structure on at least part of the first face, and (c) a second conductive film directly on extending all over a second face of the inorganic dielectric film,
wherein the first conductive film includes the plurality of patch electrode portions formed in part of the area of the mounting face for the electronic part, and a plane electrode portion formed in the remaining area of the mounting face for the electronic part,
wherein the plane electrode portion is not electrically connected to the plurality of patch electrode portions.

2. The wiring board according to claim 1, wherein the first conductive film has the plurality of patch electrode portions and a branch electrode portion configured to electrically connect each two adjacent ones of the plurality of patch electrode portions to each other.

3. The wiring board according to claim 2, wherein the electromagnetic band gap structure is formed over the overall area of the mounting face for the electronic part.

4. The wiring board according to claim 1, wherein the plurality of patch electrode portions are disposed along a peripheral side end portion of the thin film member.

5. The wiring board according to claim 2, wherein the first conductive film has an electrode pattern portion formed in a predetermined region of the first conductive film and configuring a decoupling capacitor, and the electrode pattern portion is electrically connected to a patch electrode portion of the plurality of patch electrode portions.

6. The wiring board according to claim 1, wherein the inorganic dielectric film is formed from a material selected from a group of barium titanate, barium strontium titanate, strontium titanate and lead zirconate titanate.

7. The wiring board according to claim 1, wherein one of the first conductive film and the second conductive film is connected to a power supply, and the other of the first and second conductive films is connected to the ground.

8. The wiring board according to claim 1, further comprising:
a via electrode portion configured to be provided for each of the plurality of patch electrode portions; and
a plane electrode film provided on the via electrode portion and formed over the overall area of the mounting face for the electronic part,
wherein,
the via electrode portion is connected at one end thereof to a corresponding one of the plurality of patch electrode portions and at the other end thereof to the plane electrode film.

9. The wiring board according to claim 1, wherein the wiring board is an interposer board.

10. An electronic apparatus, comprising:
a wiring board including (a) first and second wiring layers, (b) first and second interlayer insulating layers between the first and second wiring layers, and (c) a thin film member between the first and second interlayer insulating layers, the thin film member including (1) an inorganic dielectric film directly on and extending all over an area of a mounting face thereof for an electronic part, (2) a first conductive film directly on and extending all over a first face of the inorganic dielectric film and configured of a plurality of patch electrode portions disposed in a predetermined pattern corresponding to a predetermined electromagnetic band gap structure on at least part of the first face, and (3) a second conductive film extending all over a second face of the inorganic dielectric film; and
the electronic part mounted on the wiring board,
wherein the first conductive film includes the plurality of patch electrode portions formed in part of the area of the mounting face for the electronic part, and a plane electrode portion formed in the remaining area of the mounting face for the electronic part,
wherein the plane electrode portion is not electrically connected to the plurality of patch electrode portions.

11. The electronic apparatus according to claim 10, wherein the electronic part includes a first semiconductor circuit section which acts as a generating source of noise, and a second semiconductor circuit section which is influenced by the noise, and the first semiconductor circuit section and the second semiconductor circuit section are connected to a power supply through one of the first conductive film and the second conductive film and are connected to the ground through the other one of the first conductive film and the second conductive film.

12. The electronic apparatus according to claim 11, wherein the first conductive film has an electrode pattern portion formed at part of a predetermined region corresponding to a mounting region for at least one of the first semiconductor circuit section and the second semiconductor circuit section so as to configure a decoupling capacitor, and the electrode pattern portion is electrically connected to the plurality of patch electrode portions.

13. The electronic apparatus according to claim 11, wherein the first semiconductor circuit section is a digital circuit section while the second semiconductor circuit section is an analog circuit section.

14. The electronic apparatus according to claim 10, wherein the electronic part includes a single-ended high speed wiring line, part of which is provided in a formation area of the plurality of patch electrode portions.

* * * * *